(12) United States Patent
Tsurume et al.

(10) Patent No.: US 9,040,998 B2
(45) Date of Patent: May 26, 2015

(54) LIGHT-EMITTING DEVICE

(75) Inventors: Takuya Tsurume, Kanagawa (JP); Hideomi Suzawa, Kanagawa (JP); Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 160 days.

(21) Appl. No.: 13/530,392

(22) Filed: Jun. 22, 2012

(65) Prior Publication Data
US 2012/0326143 A1    Dec. 27, 2012

(30) Foreign Application Priority Data

Jun. 24, 2011   (JP) ................................ 2011-140783

(51) Int. Cl.
*H01L 27/15* (2006.01)
*H01L 27/32* (2006.01)
*H01L 27/12* (2006.01)
*H01L 51/52* (2006.01)

(52) U.S. Cl.
CPC ........ *H01L 27/3246* (2013.01); *H01L 27/1225* (2013.01); *H01L 51/5237* (2013.01); *H01L 27/3262* (2013.01)

(58) Field of Classification Search
CPC ............................. H01L 27/153; H01L 27/156
USPC ............... 313/504, 506; 349/152; 257/72, 59, 257/E27.111
See application file for complete search history.

(56) References Cited

U.S. PATENT DOCUMENTS

| 7,161,184 | B2 | 1/2007 | Miyagi et al. | |
|---|---|---|---|---|
| 7,178,927 | B2 | 2/2007 | Seo | |
| 7,753,751 | B2 | 7/2010 | Yamazaki | |
| 7,834,543 | B2 | 11/2010 | Takata | |
| 7,888,864 | B2 | 2/2011 | Young | |
| 7,943,938 | B2 | 5/2011 | Miyagi et al. | |
| 2003/0060055 | A1 | 3/2003 | Kamijima | |
| 2006/0201620 | A1 | 9/2006 | Seo | |
| 2007/0222377 | A1* | 9/2007 | Abe et al. ...................... | 313/506 |
| 2008/0296567 | A1* | 12/2008 | Irving et al. ................... | 257/43 |

(Continued)

FOREIGN PATENT DOCUMENTS

| JP | 10-275679 | 10/1998 |
|---|---|---|
| JP | 2000-260562 | 9/2000 |

(Continued)

OTHER PUBLICATIONS

Fukumoto, E. et al, "High Mobility Oxide Semiconductor TFT for Circuit Integration of AM-OLED," IDW '10: Proceedings of the 16th International Display Workshops, Dec. 1, 2010, pp. 631-634.

*Primary Examiner* — Kenneth Parker
*Assistant Examiner* — Paul Budd
(74) *Attorney, Agent, or Firm* — Husch Blackwell LLP

(57) ABSTRACT

A light-emitting device in which reduction in performance due to moisture is suppressed is provided. The light-emitting device has a structure in which a partition having a porous structure surrounds each of light-emitting elements. The partition having a porous structure physically adsorbs moisture; therefore, in the light-emitting device, the partition functions as a hygroscopic film at a portion extremely close to the light-emitting element, so that moisture or water vapor remaining in the light-emitting device or entering from the outside can be effectively adsorbed. Thus, reduction in performance of the light-emitting device due to moisture or water vapor can be effectively suppressed.

16 Claims, 11 Drawing Sheets

(56) References Cited

U.S. PATENT DOCUMENTS

2009/0146921 A1* 6/2009 Takahashi .................. 345/55
2010/0176720 A1 7/2010 Yamazaki
2011/0210335 A1 9/2011 Miyagi et al.

FOREIGN PATENT DOCUMENTS

| JP | 2005-235491 | 9/2005 |
| WO | WO 2004/044987 A2 | 5/2004 |

* cited by examiner

FIG. 1A1
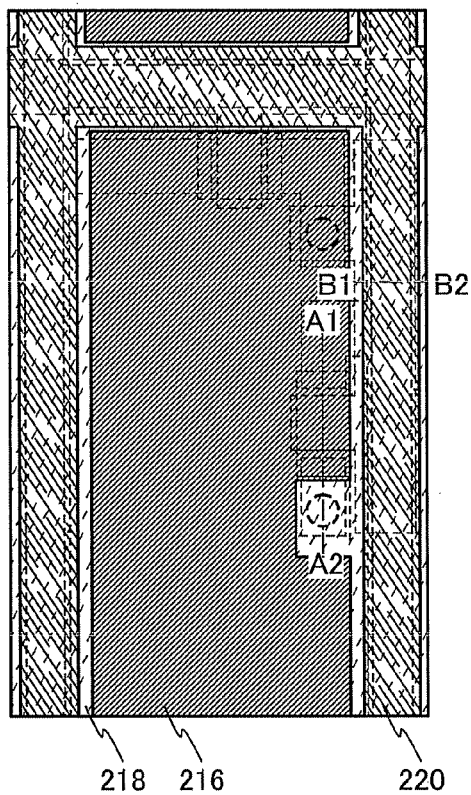
FIG. 1A2
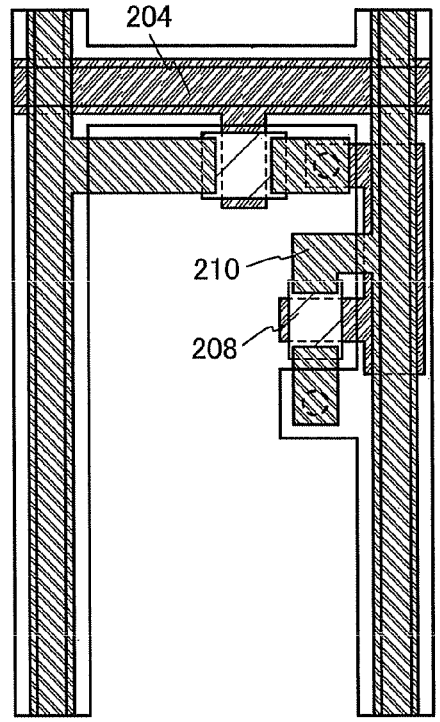
FIG. 1B
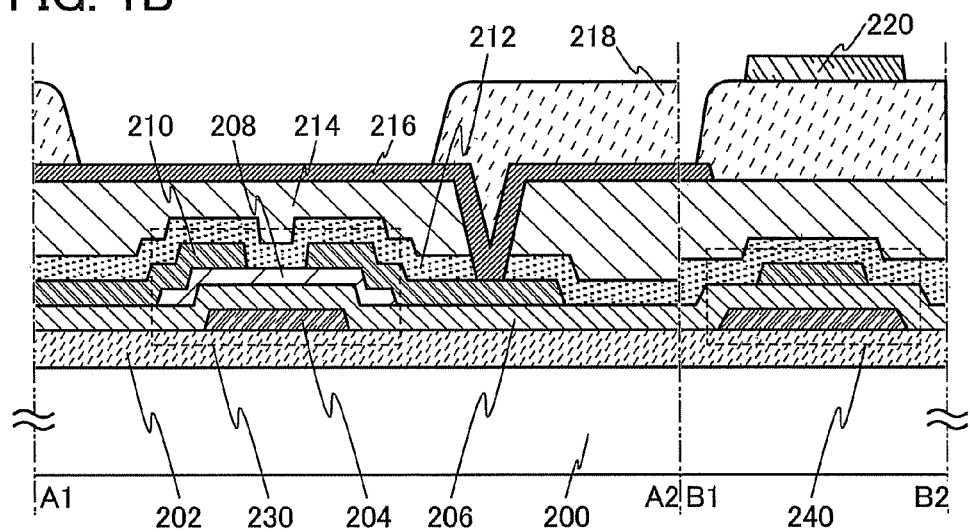

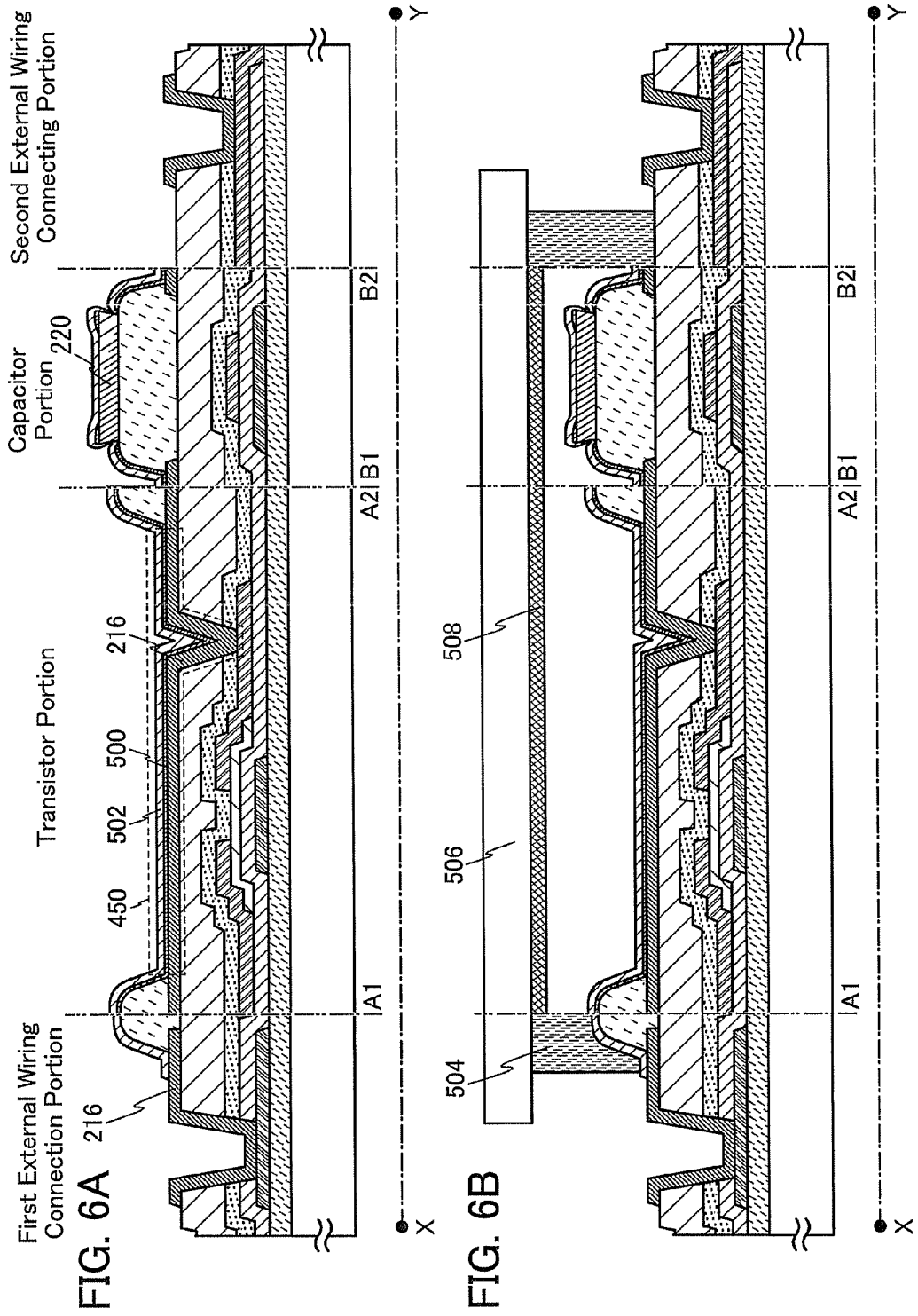

LIGHT-EMITTING DEVICE

BACKGROUND OF THE INVENTION

1. Field of the Invention

The present invention relates to a light-emitting device and a manufacturing method of the light-emitting device.

Note that in this specification, the light-emitting device refers to a display device such as an organic EL display device or a light source (a lighting device) such as lighting or a sign (e.g., a traffic light or a warning light). Further, the device includes a light-emitting element.

2. Description of the Related Art

In recent years, research has been extensively conducted on a light-emitting device including a light-emitting element utilizing a self-emission electroluminescence (hereinafter referred to as an "EL element"). The light-emitting device has extremely excellent features such as very high response speed, low-voltage driving, and low-power consumption, and no need of backlight because of its self-emitting properties. Therefore, the light-emitting device has attracted much attention as a next-generation display device and has been widely used for various devices with a relatively small image display portion (for example, a portable information terminal).

As one kind of EL elements, an "organic EL element" is given, in the organic EL element, an organic layer including at least a light-emitting layer is interposed between a pair of electrodes. In order to increase emission efficiency, the organic EL element includes a layer to control flow of electrons or holes such as an electron-injection layer, an electron-transport layer, a hole-transport layer, or a hole-injection layer in addition to the light-emitting layer. Materials for these layers are roughly classified into low molecular (monomer) materials and high molecular (polymer) materials, and thin films of the low molecular materials can be formed by an evaporation method, for example.

Further, when the organic EL element is formed over a large-area substrate, it is easy to form a planar light-emitting device having a large area without variation in light emission (or with less variation in light emission), which is extremely difficult to be formed by point light sources typified by incandescent lamps or LEDs or linear light sources typified by fluorescent lamps. In addition, the organic EL element is estimated to have higher emission efficiency than incandescent lamps or fluorescent lamps, and therefore it has attracted great attention as a light-emitting element suitable for a next-generation lighting device.

As described above, the organic EL element has attracted great attention in a variety of fields; however, it has a problem in that rapid decrease in performance is caused once the element is exposed to moisture. Against such a problem, generally, a drying agent is provided between two substrates with which the organic EL element is sealed (in this specification, a substrate over which the organic EL element is provided is referred to as a "base substrate" and a substrate provided so as to face the base substrate is referred to as a "counter substrate").

Further, in a method proposed in Patent Document 1, instead of the drying agent, a barium oxide film is formed on an inner surface of back glass (corresponding to the counter substrate in this specification) and used as a hygroscopic film.

Note that in this specification, a pair of electrodes and layers involved in light emission between the electrodes, which have a stacked-layer structure, are collectively referred to as a "light-emitting element".

REFERENCE

[Patent Document 1] Japanese Published Patent Application No. 2000-260562

SUMMARY OF THE INVENTION

In the light-emitting device in which a drying agent is provided between a base substrate and a counter substrate, the usage amount of drying agent is increased in accordance with an increase in the area where the organic EL element is formed or the drying agent needs to be provided on a large area so that hygroscopicity is not different in each place, which causes an increase in price or manufacturing time.

Further, a light-emitting device having a structure in which a thin film containing an alkaline earth metal such as barium oxide as a main component is formed on a counter substrate can be increased in size. However, since the thin film adsorbs moisture by chemical bonding (what is called chemical adsorption), its adsorption rate is much lower than that of physical adsorption using the Van der Waals force or the like. Therefore, the problem of reduction in performance of the organic EL element is not fundamentally solved. In addition, high heat is generated when moisture is adsorbed, which may be another cause of reduction in performance of the organic EL element.

In view of the foregoing problems, in this specification, it is an object to provide a light-emitting device in which reduction in performance due to moisture is suppressed.

The light-emitting device of the present invention has a structure in which a partition having a porous structure surrounds each of light-emitting elements. The partition having a porous structure physically adsorbs moisture; therefore, in the light-emitting device including the partition that functions as a hygroscopic film at a portion extremely close to the light-emitting element, moisture or water vapor remaining in the light-emitting device or entering from the outside can be effectively adsorbed. Thus, reduction in performance of the light-emitting device due to moisture or water vapor can be effectively suppressed.

That is, one embodiment of the present invention is a light-emitting device having a transistor including a source electrode, a drain electrode, a gate electrode, a gate insulating layer, and a semiconductor layer; a first electrode electrically connected to the drain electrode; a first partition including an opening portion over the first electrode and covering an end portion of the first electrode; a second partition over the first partition; an EL layer over the first electrode, the first partition, and the second partition; and a second electrode over the EL layer, in which a portion where the first electrode, the EL layer, and the second electrode overlap with one another functions as a light-emitting element, and in which the second partition is a metal oxide having a porous structure in which a plurality of holes is included.

In the light-emitting device having the above structure, the second partition can physically adsorb moisture or water vapor that may cause deterioration of the EL layer. Therefore, it is possible to provide the light-emitting device in which deterioration of the EL layer due to moisture or water vapor is suppressed.

Note that in the above light-emitting device, the second partition has a porosity of 50% or more within a range of 10% in volume from a surface to an inside of the second partition when the total volume of the second partition including the holes is 100%, whereby much moisture or water vapor can be physically adsorbed in the vicinity of the surface of the second partition; therefore, deterioration of the EL layer can be effectively suppressed.

Further, in the above light-emitting device, in the case where a given part of the second partition is cut, 50% or more of the cross sections of pores formed in a cut surface each have an area of more than or equal to 1 nm$^2$ and less than or equal to 10000 nm$^2$, whereby the second partition can physically adsorb much moisture or water vapor; therefore, deterioration of the EL layer can be effectively suppressed.

Further, in the above light-emitting device, the second partition surrounds the light-emitting element without any space, whereby moisture or water vapor entering from all directions toward the light-emitting element can be physically adsorbed; therefore, deterioration of the EL layer can be effectively suppressed.

Further, in the above light-emitting device, the angle between an upper surface of the first partition and a side surface of the second partition is less than 90°, whereby when the light-emitting element is formed, partial reduction in thickness or disconnection is generated in the EL layer due to the second partition, which presents propagation of light emitted from a light-emitting element to an adjacent light-emitting element through the EL layer.

As a material used for the second partition of the above light-emitting device, at least one kind of materials selected from silicon oxide, aluminum oxide, gallium oxide, tin oxide, titanium oxide, vanadium oxide, zirconium oxide, and niobium oxide is preferably included, whereby moisture or water vapor can be physically adsorbed with efficiency.

Further, one embodiment of the present invention is a method for manufacturing a light-emitting device, having the steps: forming a transistor including a source electrode, a drain electrode, a gate electrode, a gate insulating layer, and a semiconductor layer; forming a first electrode electrically connected to the drain electrode; forming a first partition including an opening portion over the first electrode and covering an end portion of the first electrode; forming a second partition over the first partition so that the first electrode is surrounded; forming an EL layer over the first electrode, the first partition, and the second partition; and forming a second electrode over the EL layer, in which the second partition is formed in the following manner: a solution in which at least a fine particle of a metal oxide and a dispersant are mixed is applied onto the first partition; the solution is subjected to heat treatment to form a layer functioning as a partition; and a resist pattern is formed over the layer and the layer is selectively removed using the resist pattern as a mask.

With the above manufacturing method, the second partition physically adsorbing moisture or water vapor and functioning as a drying agent can be selectively formed in the periphery of the light-emitting element; therefore, light emitted from the light-emitting element is not reflected or absorbed on the second partition and can be extracted to the outside of the light-emitting device.

Note that the heat treatment in the above manufacturing method is preferably performed at a temperature higher than or equal to 150° C. and lower than or equal to 400° C. In this manner, in various components formed before the formation of the second partition, deterioration of performance due to heat is not caused and thus the performance of the light-emitting device is not lowered.

When "B is formed above A" or "B is formed over A" is explicitly described in this specification, it does not necessarily mean that B is formed in direct contact with A. The expression includes the case where A and B are not in direct contact with each other, i.e., the case where another object is interposed between A and B.

In this specification, ordinal numbers such as "first", "second", and "third" are used in order to avoid confusion among components, and the terms do not mean the number of components.

A "transistor" in this specification is a kind of semiconductor elements and can perform amplification of current or voltage, switching operation for controlling conduction or non-conduction, or the like. A "transistor" in this specification includes an insulated-gate field effect transistor (IGFET) and a thin film transistor (TFT).

Functions of a "source" and a "drain" of a transistor in this specification are sometimes replaced with each other when a transistor of opposite polarity is used or when the direction of current flowing is changed in circuit operation, for example. Therefore, the terms "source" and "drain" can be used to denote the drain and the source, respectively, in this specification.

In this specification, the term of "electrode" or "wiring" does not limit the function of components. For example, an "electrode" is sometimes used as part of a "wiring", and vice versa. Furthermore, the term "electrode" or "wiring" can include the case where a plurality of "electrodes" or "wirings" is formed in an integrated manner.

The application of the structure described in this specification makes it possible to provide the light-emitting device which can be increased in size and in which reduction in performance due to moisture is suppressed.

BRIEF DESCRIPTION OF THE DRAWINGS

FIGS. 1A1, 1A2, and 1B illustrate a structure of a light-emitting device.

FIGS. 6A and 6B illustrate a manufacturing method of a light-emitting device.

DETAILED DESCRIPTION OF THE INVENTION

Figure 2A:
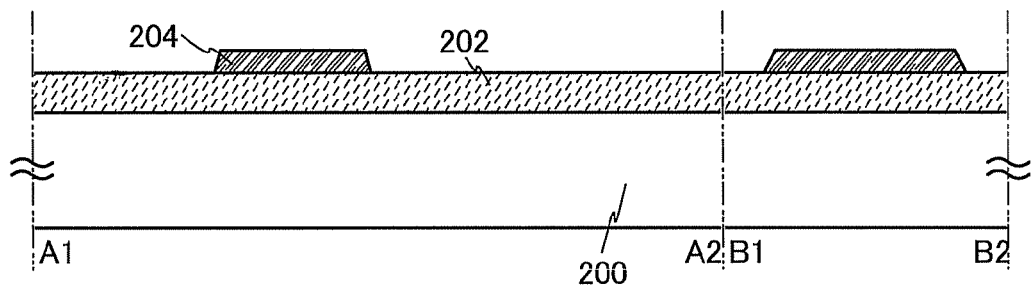
FIGS. 2A to 2C illustrate a manufacturing method of a light-emitting device.
Figure 2B:
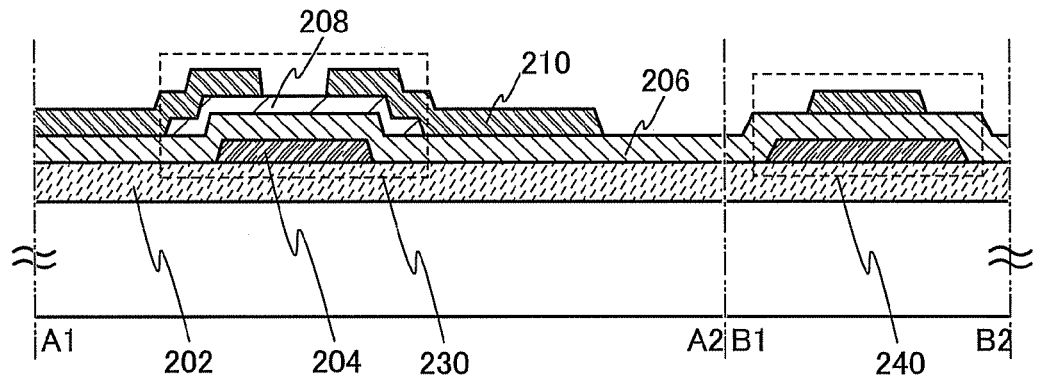

Embodiments of the present invention will be described in detail with reference to the drawings. Note that the present invention is not limited to the following description, and it will be easily understood by those skilled in the art that various changes and modifications can be made without departing from the spirit and scope of the invention. Therefore, the present invention should not be construed as being limited to the description in the following embodiments. Note that in the structure of the present invention described below, portions that are identical or portions having similar functions in different drawings are denoted by the same reference numerals, and their repetitive description will be omitted.

Embodiment 1

In this embodiment, an example of a structure of a light-emitting device according to one embodiment of the present invention and a manufacturing method thereof will be described with reference to FIGS. 1A1, 1A2, and 1B, FIGS. 2A to 2C, FIGS. 3A to 3C, and FIGS. 4A and 4B.

Figure 4A:
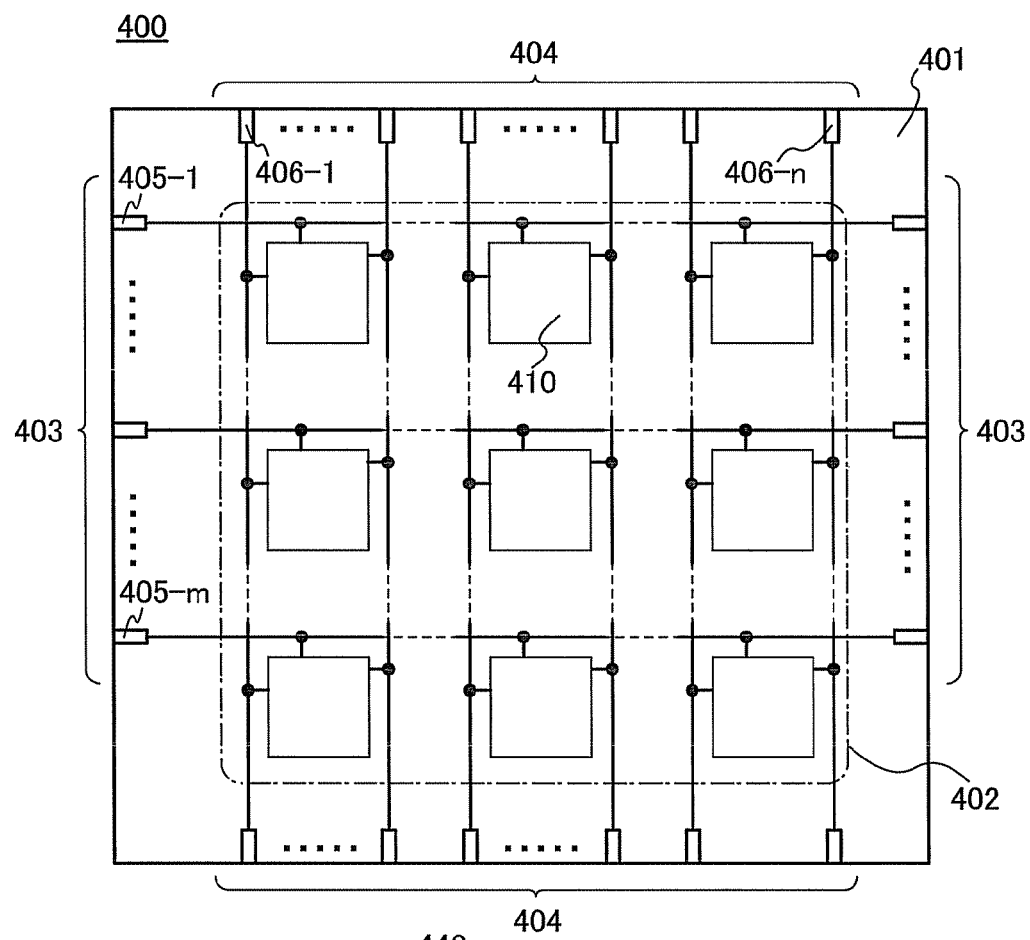
FIGS. 4A and 4B illustrate a structure of a light-emitting device.

A light-emitting device 400 of this embodiment has a circuit configuration illustrated in FIG. 4A, which has a light-emitting region 402 including a plurality of light-emitting portions 410 over a substrate 401, a terminal portion 403 including m terminals 405 (m is an integer of greater than or equal to 1), and a terminal portion 404 including n terminals 406 (n is an integer of greater than or equal to 1).

The terminal portion 403 and the terminal portion 404 are terminals to be connected to external wirings and are connected to a control circuit, a power source, or the like provided externally through the external wirings. Signals supplied from the control circuit, the power source, or the like provided externally are input to the light-emitting device 400 through the terminal portion 403 and the terminal portion 404. Note that FIG. 4A illustrates the structure in which signals are input from two portions of the terminal portion 403 and the terminal portion 404; however, the terminal portion 403 may be provided on the right and left of the light-emitting region 402 and the terminal portion 404 may be provided above and below the light-emitting region 402, so that signals may be input from four directions. An increase in the input portions increases the signal supply capability; thus, high-speed operation of the light-emitting device 400 is facilitated. Moreover, the influence of signal delay due to increase in wiring resistance, which is caused by increase in size or in definition of the light-emitting device 400, can be reduced. Moreover, the light-emitting device 400 can have redundancy, so that the reliability of the light-emitting device 400 can be improved.

Figure 4B:
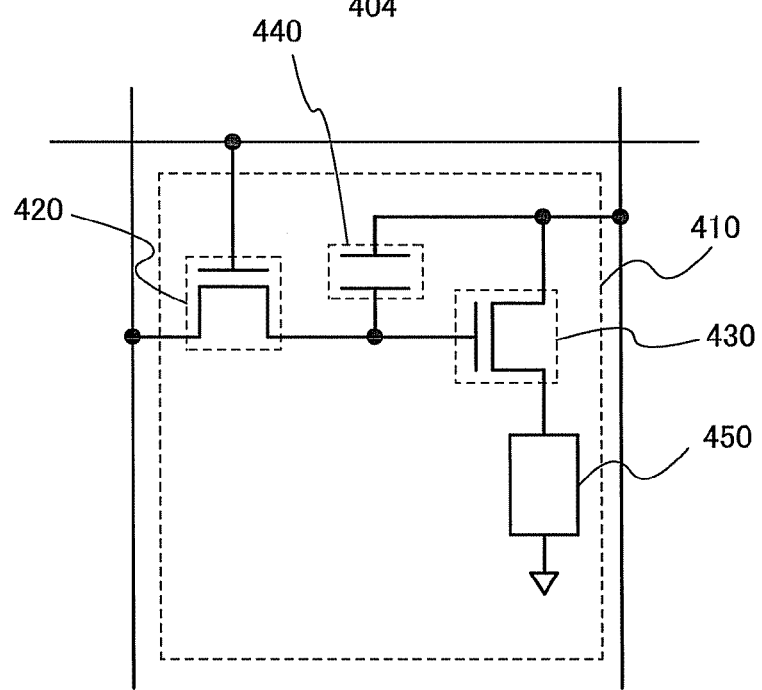

FIG. 4B illustrates an example of a circuit configuration of the light-emitting portion 410. The light-emitting portion 410 includes a transistor 420, a transistor 430, a capacitor 440, and a light-emitting element 450. Although not illustrated, the light-emitting element 450 is connected to an external connection terminal. The capacitance of the capacitor 440 provided in a light-emitting display device is set in consideration of leakage current or the like of transistors provided in a pixel portion so that charge can be held for a predetermined period. A transistor using a highly purified oxide semiconductor film for a semiconductor layer (hereinafter abbreviated to as an oxide semiconductor (OS) transistor) has an extremely low leakage current, as compared with a transistor using a silicon film or the like for a semiconductor layer. Therefore, it is preferable to use the OS transistor for at least the transistor 420 because the capacitance of a capacitor 440 can be reduced. Note that in structures other than the structure in which two transistors and one capacitor are provided for one light-emitting element (also referred to as 2T1C) as in FIG. 4B, the OS transistor may be provided as necessary, so that the capacitance of the capacitor 440 can be reduced.

A structure and a manufacturing method of the light-emitting device 400 will be described below. Note that in order to understand easily the structure of the light-emitting device 400, description is made up of two parts while focusing on the light-emitting portion and the periphery thereof: first, description is made on the structure and the manufacturing method before the formation of an EL layer (in this part, the structure and the process before the formation of a light-emitting layer are described for simplicity); then, description is made on the structure and the manufacturing method of the whole light-emitting device. Note that description will be made in this embodiment assuming that the light-emitting device 400 has a top emission structure; needless to say, the present invention is not limited thereto and a bottom emission structure, a dual emission structure, and the like may be employed.

<Structure and Manufacturing Method of Light-Emitting Portion and Peripheral Portion Thereof (Before Formation of EL Layer)>

FIGS. 1A1, 1A2, and 1B illustrate the structure of the light-emitting portion and its periphery of the light-emitting device 400 according to one embodiment of the present invention. FIG. 1A1 illustrates a top view of the light-emitting device and FIG. 1B illustrates a cross-sectional view taken along dashed-dotted line A1-A2 in FIG. 1A1 and a cross-sectional view taken along dashed-dotted line B1-B2 in FIG. 1A1. Note that in order to understand easily the structure, a film (or a layer) entirely formed is not shown in FIG. 1A1. Further, in order to understand easily the wiring structure of FIG. 1A1, FIG. 1A2 illustrates a top view of the light-emitting device, in which a third electrode 216 and a second partition 220 in FIG. 1A1 are not included.

The structure of the light-emitting portion and its periphery of the light-emitting device 400 in this embodiment includes the following components as illustrated in FIGS. 1A1, 1A2, and 1B; a base substrate 200, a base layer 202 over the base substrate 200, a first electrode 204 serving as a gate electrode over the base layer 202, a first insulating layer 206 covering the first electrode 204, a semiconductor layer 208 over the first insulating layer 206, second electrodes 210 serving as a source electrode and a drain electrode over the first electrode 204 and electrically connected to the semiconductor layer 208, a second insulating layer 212 covering the semiconductor layer 208 and the second electrodes 210, a third insulating layer 214 over the second insulating layer 212, a third electrode 216 electrically connected to one of the second electrodes 210 through an opening portion provided in part of the second insulating layer 212 and part of the third insulating layer 214, a first partition 218 provided over the third insulating layer 214 and covering a side surface and an end portion of the third electrode 216, and a second partition 220 over the first partition 218. Further, a transistor 230 which controls an operation state (a light-emitting state) of a pixel and a capacitor 240 are provided. Note that in the light-emitting device described in this embodiment, various components such as a peripheral circuit or a lead wiring are provided; however, it will be easily understood by those skilled in the art that the components can be formed over the base substrate 200 when the structure illustrated in FIGS. 1A1, 1A2, and 1B is formed; thus, description thereof is omitted here. Further, in this embodiment, the structure in which two transistors and one capacitor are provided for one pixel is described; it is needless to say that the present invention is not limited thereto.

A manufacturing method of the light-emitting portion and its periphery of the light-emitting device in this embodiment will be described below with reference to FIGS. 2A to 2C and FIGS. 3A to 3C.

First, the base substrate 200 is prepared and the base layer 202 is formed over the base substrate 200. After that, the first electrode 204 serving as a gate electrode or the like is formed over the base layer 202 (see FIG. 2A).

As the base substrate 200, any of the following can be used, for example, various glass substrates formed of general flat glass, clear flat glass, lead glass, tempered glass, and ceramic glass, non-alkali glass substrates formed of aluminosilicate glass, aluminoborosilicate glass, and barium borosilicate glass. Such a glass substrate is suitable for increasing in size, so that glass substrates of G10 size (2850 mm×3050 mm), G11 size (3000 mm×3320 mm), and the like are manufactured; thus, the light-emitting device according to one embodiment of the present invention can be mass-produced at low cost. Alternatively, an insulating substrate formed using an insulator, such as a quartz substrate or a sapphire substrate, or a semiconductor substrate fainted using a semiconductor material such as silicon whose surface is covered with an insulating material can be used.

As the base substrate 200, any of a variety of plastic substrates formed of ethylene vinyl acetate (EVA), a polyethylene terephthalate resin (PET), a polyether sulfone resin (PES), a polyethylene naphthalate resin (PEN), a polyvinyl alcohol resin (PVA), a polycarbonate resin (PC), a polyethylene resin (PE), an ABS resin, and the like can also be used. Note that in the case where the above plastic substrate is used as the base substrate 200, a single layer or a stacked layer of a film having low water vapor permeability of silicon oxide, silicon nitride, silicon oxynitride, silicon nitride oxide, aluminum oxide, or the like is preferably formed on its surface. Thus, deterioration of the EL layer 500 which is to be formed in a later step can be suppressed because a high water vapor barrier property is given to the plastic substrate.

With the use of the above plastic substrate as the base substrate 200, the light-emitting device can be reduced in thickness and weight; further, with the use of the above plastic substrate also as a counter substrate 506 which is to be used in a later step, the light-emitting device can have flexibility, so that the light-emitting device can have a higher added value.

Although there is no particular limitation on the thickness of the base substrate 200, it is preferable that the thickness be less than or equal to 3 mm, more preferably less than or equal to 1 mm for a reduction in thickness and weight of the light-emitting device.

The base layer 202 may be formed of silicon oxide, silicon nitride, silicon oxynitride, silicon nitride oxide, aluminum oxide, aluminum nitride, aluminum oxynitride, aluminum nitride oxide, or the like by a CVD method such as a plasma CVD method, a PVD method such as a sputtering method, or the like. Note that the base layer 202 may have a single-layer structure or a stacked-layer structure. In the case of a stacked-layer structure, the above films may be combined to form the base layer 202. By formation of the base layer 202, diffusion of an impurity from the base substrate 200 can be prevented and thus reduction in performance of the light-emitting device can be suppressed.

It is preferable that the thickness of the base layer 202 be more than or equal to 50 nm and less than or equal to 1000 nm, more preferably more than or equal to 100 nm and less than or equal to 500 nm in terms of an effect of preventing impurity diffusion and productivity.

Note that in the above description, the terms "oxynitride" and "nitride oxide" are used. They represent which of the content of oxygen and the content of nitrogen contained in a formed layer is large, and "oxynitride" means that the layer contains more oxygen than nitrogen.

The first electrode 204 may be formed in the following manner, for example: a conductive layer is formed by an evaporation method such as a vacuum evaporation method, a PVD method such as a sputtering method, or the like; a resist mask in a desired pattern is formed over the conductive layer by a photolithography method, an inkjet method, or the like; and the conductive layer is selectively removed by a dry etching method, a wet etching method, or the like. As the conductive layer, for example, a single layer or a stacked layer of any of metal materials such as aluminum, nickel, tantalum, chromium, tungsten, molybdenum, cobalt, manganese, magnesium, titanium, palladium, zirconium, beryllium, neodymium, scandium, gold, platinum, silver, and copper or an alloy containing any of these metal materials can be used.

The first electrode 204 may be formed using a conductive metal oxide. As the conductive metal oxide, indium oxide ($In_2O_3$), tin oxide ($SnO_2$), zinc oxide (ZnO), indium oxide-tin oxide ($In_2O_3$—$SnO_2$, which is abbreviated to ITO in some cases), indium oxide-zinc oxide ($In_2O_3$—ZnO), or any of these metal oxide materials in which silicon or silicon oxide is included can be used. The conductive metal oxide has higher transmittance of visible light than the metal materials; therefore, by using the conductive metal oxide for a light-emitting device having a structure in which the light emission from an EL layer is extracted to the first electrode 204 side (a bottom emission structure or a dual emission structure), even when the aperture ratio of a pixel portion is increased, the light emission from the EL layer can be efficiently extracted outside.

It is preferable that the thickness of the first electrode 204 be more than or equal to 50 nm and less than or equal to 1000 nm, more preferably more than or equal to 100 nm and less than or equal to 500 nm in terms of ensuring its conductivity and productivity.

Next, the first insulating layer 206 covering the first electrode 204 is formed and the semiconductor layer 208 overlapping with the first electrode is formed over the first insulating layer 206. After that, the second electrode 210 serving as a source electrode, a drain electrode, or the like which is electrically contacted to the semiconductor layer 208 is formed (see FIG. 2B).

As a material of the first insulating layer 206, a material such as silicon oxide, silicon nitride, or silicon oxynitride can be used. Alternatively, a material including a Group 13 element and oxygen can be used. As the material including a Group 13 element and oxygen, for example, gallium oxide, aluminum oxide, aluminum gallium oxide, or the like can be used. Furthermore, the first insulating layer 206 may be formed so as to include tantalum oxide, hafnium oxide, yttrium oxide, hafnium silicate ($HfSi_xO_y$ (x>0, y>0)), hafnium silicate ($HfSi_xO_y$ (x>0, y>0)) to which nitrogen is added, hafnium aluminate ($HfAl_xO_y$ (x>0, y>0)) to which nitrogen is added, or the like. The first insulating layer 206 may have a single-layer structure or a stacked-layer structure in which these materials are combined.

Although there is no particular limitation on the thickness of the first insulating layer 206, in the case where the size of a circuit formed in the light-emitting device is miniaturized, the first insulating layer 206 is preferably thin in order to ensure the operation of a semiconductor element (for example, a transistor 230). For example, in the case of using silicon oxide, the thickness can be more than or equal to 1 nm and less than or equal to 100 nm, preferably more than or equal to 10 nm and less than or equal to 50 nm.

Note that the first insulating layer 206 is preferably formed using a film deposited by a method in which an impurity such as hydrogen or water does not enter the film. For example, the first insulating layer 206 is preferably formed by a sputtering method using a high-purity gas from which an impurity such as hydrogen or water is removed. This is because, if an impurity such as hydrogen or water is contained in the first insulating layer 206, when the semiconductor layer 208 is formed using an oxide semiconductor material, an impurity such as hydrogen or water enters the semiconductor layer 208 or oxygen in the semiconductor layer 208 is extracted by an impurity such as hydrogen or water, so that a channel of the semiconductor layer 208 may have lower resistance (become an n-type) and a parasitic channel might be formed.

The semiconductor layer 208 may be formed in the following manner, for example: a semiconductor film is formed by a PVD method such as a sputtering method or a CVD method such as a plasma CVD method. After that, a resist mask is formed over the film by a photolithography method or the like and then, the semiconductor film is selectively removed by a dry etching method, a wet etching method, or the like. As the semiconductor film, for example, a film deposited using a material such as silicon, germanium, silicon germanium, silicon carbide, and gallium arsenide may be used. In addition, an oxide semiconductor material may be used as the material for the semiconductor film, besides the above materials.

It is preferable that the thickness of the semiconductor layer 208 be more than or equal to 1 nm and less than or equal to 100 nm, more preferably more than or equal to 3 nm and less than or equal to 50 nm.

Note that, there are various differences between the case where a semiconductor film is deposited using an oxide semiconductor material and a semiconductor layer is formed using the semiconductor film and the above-described case where a semiconductor layer is formed using a material such as silicon. Therefore, the deposition of a semiconductor film using an oxide semiconductor material and the formation of a semiconductor layer using the semiconductor film will be described below in detail.

In the case where the semiconductor film is deposited using an oxide semiconductor material, the oxide semiconductor material preferably contains at least indium (In) or zinc (Zn). In particular, In and Zn are preferably contained. Further, as a stabilizer for reducing variation in electric characteristics of a transistor, one or more kinds of gallium (Ga), tin (Sn), hafnium (Hf), and aluminum (Al) is preferably contained in addition to indium (In) and zinc (Zn).

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As a material used for the semiconductor film, for example, any of the following can be used: indium oxide; tin oxide; zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Note that here, for example, an "In—Ga—Zn-based oxide" means an oxide semiconductor material containing In, Ga, and Zn as its main components and there is no particular limitation on the ratio of In:Ga:Zn. The In—Ga—Zn-based oxide may contain a metal element other than the In, Ga, and Zn.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or any of oxide semiconductor materials whose composition is in the neighborhood of the above compositions may be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), In:Sn:Zn=2:1:5 (=1/4:1/8:5/8), or any of oxide semiconductor materials whose composition is in the neighborhood of the above compositions may be used.

Note that for example, the expression "the composition of an oxide semiconductor material including In, Ga, and Zn at the atomic ratio, In:Ga:Zn=a:b:c (a+b+c=1), is in the neighborhood of the composition of an oxide semiconductor material including In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$, and r may be 0.05, for example. The same applies to other oxide semiconductor materials.

The relative density of a metal oxide in the target is greater than or equal to 80%, preferably greater than or equal to 95%, more preferably greater than or equal to 99.9%. The use of a target with high relative density makes it possible to form an oxide semiconductor film with a dense structure.

However, without limitation to the materials given above, a material with an appropriate composition may be used depending on needed semiconductor characteristics (e.g., mobility, threshold voltage, and variation). In order to obtain the needed semiconductor characteristics, it is preferable that the carrier density, the impurity concentration, the defect density, the atomic ratio between a metal element and oxygen, the interatomic distance, the density, and the like be set to appropriate values.

For example, when a transistor in which a semiconductor film is deposited using an In—Sn—Zn-based oxide semiconductor material and a semiconductor layer is formed using the film, a transistor including such a layer has high mobility (Eri Fukumoto, Toshiaki Arai, Narihiro Morosawa, Kazuhiko Tokunaga, Yasuhiro Terai, Takashige Fujimori, and Tatsuya Sasaoka, "High Mobility Oxide Semiconductor TFT for Circuit Integration of AM-OLED", IDW'10, pp. 631-634).

Note that a transistor in which a semiconductor film containing In, Sn, and Zn as its main components is deposited and a semiconductor layer is formed using the film can have favorable characteristics by depositing the semiconductor film while a substrate is heated or by performing heat treatment after the semiconductor film is deposited. Note that a main component refers to an element included in composition at 5 atomic % or more.

By intentionally heating the substrate when the semiconductor film including In, Sn, and Zn as its main components is deposited, the field-effect mobility of the transistor whose semiconductor layer is formed using the film can be improved. Further, the threshold voltage of the transistor can be positively shifted to make the transistor normally off.

The transistor in which a semiconductor film containing In, Sn, and Zn as its main components is deposited and a semiconductor layer (at least a channel formation region) is formed using the film is described above. Also in the case where a semiconductor film containing In, Ga, and Zn as its main components is deposited and a semiconductor layer (at least a channel formation region) is formed using the film, the mobility of a transistor including such a semiconductor layer can be increased by reducing the defect density in a bulk in the semiconductor layer.

An oxide semiconductor film formed using the above oxide semiconductor material is in a single crystal state, a polycrystalline (also referred to as polycrystal) state, an amorphous state, or the like.

Preferably, a CAAC-OS (c-axis aligned crystalline oxide semiconductor) film can be used as the oxide semiconductor film.

The CAAC-OS film is not completely single crystal nor completely amorphous. The CAAC-OS film is an oxide semiconductor film with a crystal-amorphous mixed phase structure where crystal parts and amorphous parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

With use of the CAAC-OS film in a transistor, change in electric characteristics of the transistor due to irradiation with visible light or ultraviolet light can be reduced. Thus, the transistor has high reliability.

For example, the CAAC-OS film is formed by a sputtering method with a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particle reaches a substrate while maintaining their crystal state, whereby the CAAC-OS film can be formed.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is 30 vol % or higher, preferably 100 vol %.

As an example of the sputtering target, an In—Ga—Zn—O compound target is described below.

The In—Ga—Zn—O compound target, which is polycrystalline, is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y and Z are given positive numbers. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

In an oxide semiconductor having crystallinity, defects in the bulk can be further reduced and when a surface flatness is improved, mobility higher than that of an oxide semiconductor in an amorphous state can be obtained. In order to improve the surface flatness, the oxide semiconductor is preferably formed on a flat surface. Specifically, it is preferable that the oxide semiconductor be formed on a surface with an average surface roughness ($R_a$) of 1 nm or less, preferably 0.3 nm or less.

Note that, $R_a$ is obtained by three-dimension expansion of arithmetic average roughness that is defined by JIS B 0601: 2001 (ISO4287:1997) so as to be applied to a curved plane.

The $R_a$ can be expressed as an "average value of the absolute values of deviations from a reference surface to a specific surface" and is defined by the formula below.

[FORMULA 1]

$$R_a = \frac{1}{S_0} \int_{y1}^{y2} \int_{x1}^{x2} |f(x, y) - Z_0| dx dy \quad (1)$$

Here; the specific surface is a surface which is a target of roughness measurement, and is a quadrilateral region which is specified by four points represented by the coordinates $(x_1, y_1, f(x_1, y_1))$, $(x_1, y_2, f(x_1, y_2))$, $(x_2, y_1, f(x_2, y_1))$, and $(x_2, y_2, f(x_2, y_2))$. $S_0$ represents the area of a rectangle which is obtained by projecting the specific surface on the xy plane, and $Z_0$ represents the height of the reference surface (the average height of the specific surface). $R_a$ can be measured using an atomic force microscope (AFM).

In the case where the semiconductor film is deposited using an oxide semiconductor material, the atmosphere in which the semiconductor film is formed is preferably an inert atmosphere, an oxidizing atmosphere, or a mixed atmosphere containing an inert gas and an oxidizing gas. The oxidizing atmosphere is an atmosphere that contains an oxidizing gas such as oxygen, ozone, or nitrous oxide as its main component and, preferably, does not contain water, hydrogen, and the like. For example, the purity of oxygen, ozone, or nitrous oxide introduced into a heat treatment apparatus is set to 6N (99.9999%) or higher, preferably 7N (99.99999%) or higher (i.e., the impurity concentration is lower than 1 ppm, preferably lower than 0.1 ppm). As the oxidizing atmosphere, an oxidizing gas and an inert gas may be mixed to be used. In that case, the mixture contains an oxidizing gas at a concentration of greater than or equal to 10 ppm. Further, an inert atmosphere refers to an atmosphere containing an inert gas such as nitrogen or a rare gas (e.g., helium, neon, argon, krypton, or xenon) as its main component. For example, the purity of an inert gas introduced into a heat treatment apparatus is set to 6N (99.9999%) or higher, preferably 7N (99.99999%) or higher (i.e., the impurity concentration is lower than 1 ppm, preferably lower than 0.1 ppm). Specifically, the concentration of a reactive gas such as an oxidizing gas is lower than 10 ppm.

In forming the semiconductor film using an oxide semiconductor material by a sputtering method, for example, an object to be processed (in this embodiment, the base substrate 200 over which the base layer 202, the first electrode 204, and the first insulating layer 206 are formed) is held in a treatment chamber that is maintained under reduced pressure, and the object to be processed is heated to a temperature higher than or equal to 100° C. and lower than 550° C., preferably higher than or equal to 200° C. and lower than or equal to 400° C. Alternatively, the temperature of the object in forming the oxide semiconductor film may be room temperature. Then, moisture in the treatment chamber is removed, a sputtering gas from which hydrogen, water, or the like is removed is introduced, and the above-described target is used; thus, the oxide semiconductor film is formed. By forming the oxide semiconductor film while the object is heated, an impurity in the oxide semiconductor film, such as hydrogen or water, can be reduced. Therefore, it is possible that the field-effect mobility is improved. Moreover, damage due to sputtering can be reduced. In order to remove moisture in the treatment chamber, an entrapment vacuum pump is preferably used. For example, a cryopump, an ion pump, a titanium sublimation pump, or the like can be used. A turbo pump provided with a cold trap may be used. Since an impurity such as moisture can be removed from the treatment chamber evacuated with a cryopump or the like, the concentration of an impurity in the oxide semiconductor film can be reduced.

The sputtering conditions are as follows, for example: the distance between the object and the target is 170 mm; the pressure is 0.4 Pa; the direct current (DC) power is 0.5 kW; and the atmosphere is an oxygen (100% oxygen) atmosphere, an argon (100% argon) atmosphere, or a mixed atmosphere of oxygen and argon. Note that a pulsed direct current (DC) power source is preferably used because particles (such as powder substances generated in film formation) can be reduced and the film thickness can be uniform.

Note that before the oxide semiconductor film is formed by the above method, reverse sputtering in which plasma is generated with an argon gas introduced is preferably performed so that a material attached to a surface where the oxide semiconductor film is to be formed is removed. Here, the reverse sputtering is a method in which ions collide with a surface to be processed so that the surface is modified, in contrast to normal sputtering in which ions collide with a sputtering target. An example of a method for making ions collide with a surface to be processed is a method in which high-frequency voltage is applied to the surface to be processed in an argon atmosphere so that plasma is generated in the vicinity of the object to be processed. Note that an atmosphere of nitrogen, helium, oxygen, or the like may be used instead of an argon atmosphere.

Then, with the use of a photolithography method, an inkjet method, or the like, a resist in a desired pattern is formed over the semiconductor film deposited by the above method. Further, unnecessary part of the oxide semiconductor film is selectively removed with the use of a dry etching method, a wet etching method, or the like. In this manner, the semiconductor layer 208 may be formed.

In the case of employing dry etching as the etching method of the semiconductor film, the etching gas is preferably a gas containing chlorine (a chlorine-based gas such as chlorine ($Cl_2$), boron trichloride ($BCl_3$), silicon tetrachloride ($SiCl_4$), or carbon tetrachloride ($CCl_4$)). Alternatively, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like can be used.

Further, in the case where a wet etching method is used as the etching of the semiconductor film, as an etchant used for the wet etching, a mixed solution of phosphoric acid, acetic acid, and nitric acid, organic acid such as citric acid or oxalic acid, or the like can be used. Wet etching can be conducted, for example, using ITO-07N (produced by KANTO CHEMICAL CO., INC.).

Note that the semiconductor layer formed by the above method contains moisture or hydrogen (including a hydroxyl group) as impurities in some cases. Moisture or hydrogen easily forms donor levels and thus serves as an impurity in the semiconductor layer. In order to reduce impurities such as moisture and hydrogen in the semiconductor layer (dehydrate or dehydrogenate the semiconductor layer), the semiconductor layer may be subjected to heat treatment for dehydration or dehydrogenation (hereinafter abbreviated to first heat treatment) in a reduced-pressure atmosphere, an inert gas atmosphere such as a nitrogen atmosphere or a rare gas atmosphere, an oxygen gas atmosphere, or the like.

By performing the first heat treatment on the semiconductor layer, moisture or hydrogen in the semiconductor film can be eliminated. Specifically, heat treatment may be performed at a temperature higher than or equal to 250° C. and lower than or equal to 750° C., preferably higher than or equal to 400° C. and lower than the strain point of a substrate. For example, heat treatment may be performed at 500° C. for approximately three minutes to six minutes. When an RTA method is used for the heat treatment, dehydration or dehydrogenation can be performed in a short time; therefore, treatment can be performed even at a temperature higher than the strain point of a glass substrate.

The heat treatment apparatus is not limited to an electric furnace and may be the one provided with a device for heating an object to be processed, using heat conduction or heat radiation from a heating element such as a resistance heating element. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas which does not react with an object to be processed by heat treatment, like nitrogen or a rare gas such as argon is used.

In the first heat treatment, it is preferable that moisture, hydrogen, and the like be not contained in nitrogen or a rare gas such as helium, neon, or argon. Alternatively, the purity of nitrogen or a rare gas such as helium, neon, or argon introduced into the heat treatment apparatus is set to 6 N (99.9999%) or higher, preferably 7 N (99.99999%) or higher (i.e., the impurity concentration is lower than or equal to 1 ppm, preferably lower than or equal to 0.1 ppm).

The semiconductor layer which has been subjected to the first heat treatment may be further subjected to second heat treatment. By performing the second heat treatment in an oxidation atmosphere, oxygen is supplied to the semiconductor layer; oxygen deficiency caused in the semiconductor layer by the first heat treatment is accordingly compensated. Thus, the second heat treatment may be referred to as oxygen supplying treatment. The second heat treatment may be performed at a temperature of higher than or equal to 200° C. and lower than the strain point of the substrate, preferably higher than or equal to 250° C. and lower than or equal to 450° C. The treatment time is 3 minutes to 24 hours. As the treatment time is increased, the proportion of a crystal region with respect to that of an amorphous region in the semiconductor layer can be increased. Note that heat treatment for longer than 24 hours is not preferable because the productivity is reduced.

The oxidizing atmosphere is an atmosphere containing an oxidizing gas. Oxidation gas is oxygen, ozone, nitrous oxide, or the like, and it is preferable that the oxidation gas does not contain water, hydrogen, and the like. For example, the purity of oxygen, ozone, or nitrous oxide introduced into a heat treatment apparatus is set to 6N (99.9999%) or higher, preferably 7N (99.99999%) or higher (i.e., the impurity concentration is lower than 1 ppm, preferably lower than 0.1 ppm). As the oxidizing atmosphere, an oxidizing gas and an inert gas may be mixed to be used. In that case, the mixture contains an oxidizing gas at a concentration of greater than or equal to 10 ppm. Further, an inert atmosphere refers to an atmosphere containing an inert gas such as nitrogen or a rare gas (e.g., helium, neon, argon, krypton, or xenon) as its main component. Specifically, the concentration of a reactive gas such as an oxidizing gas is lower than 10 ppm.

Note that the second heat treatment can be performed using the same heat treatment apparatus and the same gas as those used for the first heat treatment. It is preferable that the first heat treatment for dehydration or dehydrogenation and the second heat treatment for oxygen supply be successively performed in terms of productivity.

By intentionally heating the substrate during the deposition of the semiconductor film or by performing heat treatment after the formation of the semiconductor layer, hydrogen, a hydroxyl group, or moisture can be released and removed from the semiconductor film or the semiconductor layer, which may lead to an increase in field-effect mobility. Such an improvement in field-effect mobility is presumed to be achieved not only by removal of impurities by dehydration or dehydrogenation but also by a reduction in interatomic distance due to an increase in density. The oxide semiconductor film or the semiconductor layer can be crystallized by being purified by removal of impurities from the semiconductor film or the semiconductor layer.

Further, the above heat treatment contributes not only to improving field-effect mobility but also to making the transistor normally off. For example, in the case where a semiconductor film including In, Sn, and Zn as its main components is deposited without intentional heating of the substrate, the threshold voltage of a transistor using such a film tends to be shifted in the negative direction. However, in the case of using a semiconductor film deposited while heating the substrate intentionally (at a temperature of 150° C. or higher, preferably 200° C. or higher, and more preferably 400° C. or higher), it is observed that the negative shift of the threshold voltage is prevented and the threshold voltage is shifted so that the transistor becomes normally off.

By intentionally heating the substrate during the deposition of the semiconductor film or by performing heat treatment after the formation of the semiconductor layer, the stability against gate-bias stress can be increased.

Note that the threshold voltage can also be controlled by changing the ratio of In, Sn, and Zn; with an oxide semiconductor material having a composition ratio of In:Sn:Zn=2:1:3, a normally-off transistor is expected to be formed. In addition, an oxide semiconductor material having a composition ratio of In:Sn:Zn=2:1:3 enables an oxide semiconductor film having high crystallinity to be formed.

As described above, by intentionally heating the substrate during the deposition of the semiconductor film or by performing heat treatment after the formation of the semiconductor layer, the semiconductor layer becomes a highly purified non-single-crystal oxide semiconductor and ideally, a field-effect mobility exceeding 100 $cm^2/Vsec$ is expected to be realized.

Further, after the deposition of the semiconductor film and/or after the formation of the semiconductor layer, oxygen supplying treatment may be performed on the semiconductor layer (or the semiconductor film), hydrogen, a hydroxyl group, or moisture included therein may be released, and the oxide semiconductor may be crystallized by the heat treatment or by another heat treatment performed later. By such crystallization treatment or recrystallization treatment, a non-single crystal oxide semiconductor having favorable crystallinity can be obtained.

Here, the "oxygen supplying treatment" means that oxygen (which includes at least one of an oxygen radical, an oxygen atom, and an oxygen ion) is added to a bulk of the semiconductor layer (or the semiconductor film). Note that the term "bulk" is used in order to clarify that oxygen is added not only to a surface of a thin film but also to the inside of the thin film. In addition, "oxygen doping" includes "oxygen plasma doping" in which oxygen which is made to be plasma is added to a bulk. By the oxygen doping treatment, oxygen can be included in the semiconductor layer 208 (or the semiconductor film) or the first insulating layer 206 more than that in the stoichiometric composition.

The oxygen doping treatment is preferably performed by an inductively coupled plasma (ICP) method, using oxygen plasma which is excited by a microwave (with a frequency of 2.45 GHz, for example).

The supply of an oxygen ion to the semiconductor layer (or the semiconductor film) can be referred to as oxygen supplying treatment for replenishing oxygen in the semiconductor layer (or the semiconductor film) as well as the second heat treatment. The excess oxygen is oxygen existing mainly between lattices. When the concentration of excess oxygen is set to higher than or equal to $1 \times 10^{16}/cm^3$ and lower than or equal to $2 \times 10^{20}/cm^3$, excess oxygen can be included in the semiconductor layer (or the semiconductor film) without causing crystal distortion or the like.

The above is a specific description of the deposition of the semiconductor film using an oxide semiconductor material and the formation of the semiconductor layer using the semiconductor film.

The second electrodes 210 may be formed using a material and a method similar to those of the first electrode 204 and to a thickness similar to that of the first electrode 204.

Figure 2C:
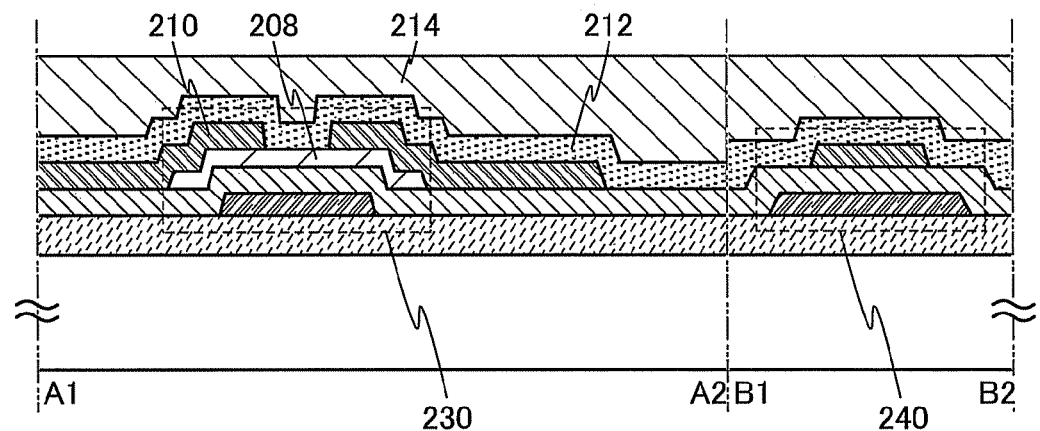

Next, the second insulating layer 212 and the third insulating layer 214 are formed over the first insulating layer 206, the semiconductor layer 208, and the second electrodes 210 (see FIG. 2C).

The second insulating layer 212 and the third insulating layer 214 may be formed of silicon oxide, silicon nitride, silicon oxynitride, silicon nitride oxide, aluminum oxide, aluminum nitride, aluminum oxynitride, aluminum nitride oxide, or the like by a CVD method such as a plasma CVD method or a PVD method such as a sputtering method. Alternatively, an organic insulating material such as a polyimide resin or an acrylic resin can be used. For example, the second insulating layer 212 may be formed of an inorganic material film having a high barrier property against moisture, water vapor, and the like and the third insulating layer 214 may be formed of an organic resin which is highly effective in flattening steps. In such a manner, the second insulating layer 212 prevents moisture or water vapor from entering the transistor 230 and the third insulating layer 214 flattens a surface, resulting in the prevention of variation in the thickness in a surface of a third conductive layer to be formed in a later step or disconnection in the third conductive layer due to the surface unevenness.

It is preferable that the thickness of the second insulating layer 212 be more than or equal to 50 nm and less than or equal to 1000 nm, more preferably more than or equal to 100 nm and less than or equal to 500 nm in terms of an effect of a barrier property against moisture, water vapor, or the like and productivity. Further, it is preferable that the thickness of the third insulating layer 214 be more than or equal to 100 nm and less than or equal to 5000 nm, more preferably more than or equal to 300 nm and less than or equal to 3000 nm in terms of unevenness coverage and productivity.

Figure 3A:
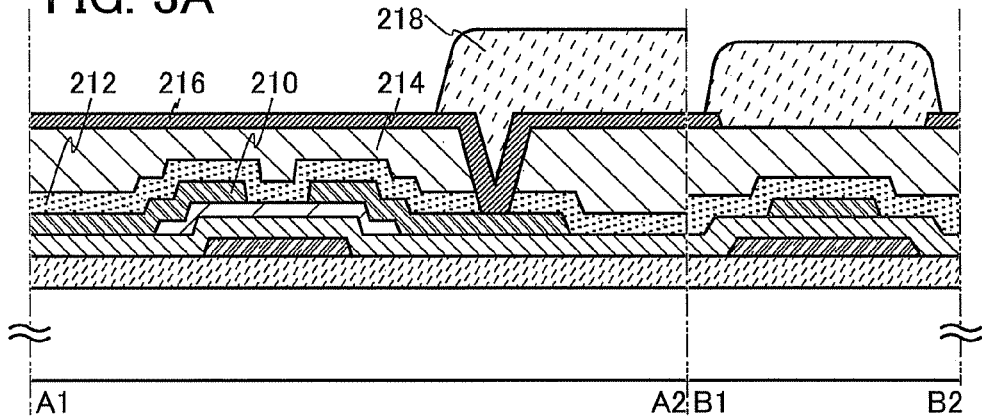
FIGS. 3A to 3C illustrate a manufacturing method of a light-emitting device.

Next, the third electrode 216 which is electrically connected to one of the second electrodes 210 and the first partition 218 which covers a side surface and an end portion of the third electrode 216 are formed over the third insulating layer 214 (see FIG. 3A).

The third electrode 216 may be formed using a material and a method similar to those of the first electrode 204 and to a thickness similar to that of the first electrode 204. Further, for electrical connection between the third electrode 216 and the one of the second electrodes 210, before a conductive film serving as the third electrode 216 is formed over the third insulating layer 214, an opening portion needs to be formed in the second insulating layer 212 and the third insulating layer 214, so that the one of the second electrodes 210 is partly exposed. Note that an opening portion may be formed in the second insulating layer 212 and the third insulating layer 214 in the following manner: a resist mask in a desired pattern is formed over the third insulating layer 214 with the use of a photolithography method, an inkjet method, or the like and the second insulating layer 212 and the third insulating layer 214 are selectively removed with the use of a dry etching method, a wet etching method, or the like.

Note that in the case where the light-emitting device has a bottom emission structure, light needs to be extracted from a base substrate 200 side; therefore, the third electrode 216 may be formed using a conductive metal oxide. As the conductive metal oxide, indium oxide ($In_2O_3$), tin oxide ($SnO_2$), zinc oxide (ZnO), indium oxide-tin oxide ($In_2O_3$—$SnO_2$, which is abbreviated to ITO in some cases), indium oxide-zinc oxide ($In_2O_3$—ZnO), or any of these metal oxide materials in which silicon or silicon oxide is included can be used.

The first partition 218 may be faulted in the following manner: a material having an insulating property is applied over the third insulating layer 214 by a spin coating method, a printing method, a dispensing method, an ink-jet method, or the like, and cure treatment (e.g., heat treatment or light irradiation treatment) is performed depending on the applied material, whereby a layer is formed; a resist mask in a desired pattern is formed over the layer with the use of a photolithography method, an inkjet method, or the like; the layer is selectively removed with the use of a dry etching method, a wet etching method, or the like. As the material having an insulating property, an organic resin such as an acrylic resin, a polyimide resin, a polyamide resin, a polyamide-imide resin, or an epoxy resin, an inorganic material used for the base layer 202, or an organic-inorganic hybrid material such as organic polysiloxane, can be used. It is particularly preferable that the first partition 218 be formed using a photosensitive organic resin or an organic-inorganic hybrid material so that a side surface of the first partition 218 is formed as an inclined surface with continuous curvature, whereby disconnection in an EL layer or a fourth electrode to be formed in a later step can be suppressed.

The thickness of the first partition 218 is preferably greater than that of the third electrode 216 and less than or equal to 5000 nm, more preferably greater than that of the third electrode 216 by 100 nm or more and less than or equal to 3000 nm in terms of an effect of suppressing disconnection of the EL layer or the fourth electrode formed in the later step and productivity.

Figure 3B:
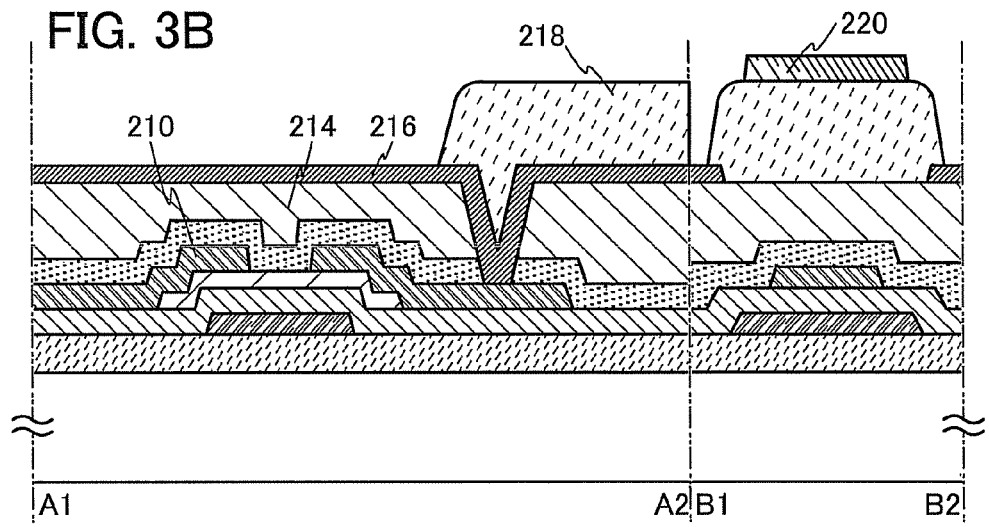

Next, the second partition 220 is formed over the first partition 218 (see FIG. 3B). As the second partition 220, a metal oxide having a porous structure may be used. Note that in the "porous structure" in this specification, when a given part of the second partition is cut in parallel to the surface direction of the base substrate 200, it is preferable that 50% or more of the cross sections of pores formed in the cut surface each have an area of more than or equal to $1\ nm^2$ and less than or equal to $10000\ nm^2$.

Since the metal oxide having a porous structure adsorbs a substance such as moisture by physical force such as the Van der Waals force (physical adsorption), it has a high adsorption rate. Therefore, the use of the metal oxide having a porous structure as the second partition 220 makes it possible to effectively absorb moisture or water vapor which is not completely removed in the formation of the first partition 218, moisture or water vapor which is adsorbed onto the surface of the partition after the formation of the first partition 218, or moisture or water vapor which enters from the outside of the light-emitting device (particularly, moisture or water vapor which reaches the EL layer through the inside of the first partition 218). Therefore, deterioration of the EL layer due to moisture or water vapor can be suppressed. Note that the metal oxide having a porous structure does not generate high heat at the time of moisture absorption unlike chemical adsorption; therefore, the EL layer is not deteriorated due to heat generation at the time of moisture absorption.

Further, as illustrated in FIG. 1A1, the second partition 220 having such characteristics is formed at a portion extremely close to the light-emitting portion so as to surround a portion where a light-emitting element is formed (a portion where the third electrode 216 is exposed in FIG. 1A1) by the formation of an EL layer 500 and a fourth electrode 502 in the later step, whereby moisture or water vapor can be effectively absorbed. In addition, in the case of the structure in which light is emitted from the EL layer 500 to the counter substrate side (also referred to what is called a top emission structure), light emitted from the EL layer 500 is not reflected or/nor absorbed; therefore, a reduction in chromaticity or an increase in power consumption caused by loss of light emission due to light reflection or light absorption can be suppressed.

Therefore, as described in this embodiment, the structure in which the second partition 220 is formed at a portion extremely close to the light-emitting portion so as to surround the light-emitting portion is applied to a light-emitting device having a top emission structure, whereby a further effect such as suppression of a reduction in chromaticity or suppression of an increase in power consumption can be obtained.

Note that, in the case where the second partition is formed in the light-emitting portion, a light-emitting region is decreased; therefore, the second partition is preferably formed over the first partition.

The second partition 220 may be formed in the following manner: a solution in which fine particles of a metal oxide, each of which has been ground to have a particle size less than 1 μm, preferably greater than or equal to 1 nm and less than or equal to 100 nm, more preferably greater than or equal to 3 nm and less than or equal to 50 nm and a material having a function of suppressing the aggregation of particles of the metal oxide (also referred to as a dispersant) are mixed is applied onto the first partition with the use of a dip coating method or a spin coating method, and then the solution is subjected to heat treatment to form a porous thin film. Note that, the heat treatment is preferably performed at temperatures at which: the dispersant is vaporized, particles of the metal oxide are bonded to each other, and the shape of the first partition is not changed. Specifically, the heat treatment is preferably performed at a temperature higher than or equal to 150° C. and lower than or equal to 400° C., more preferably higher than or equal to 250° C. and lower than or equal to 350° C. Although there is no particular limitation on the apparatus used for the heat treatment, it is preferable that an apparatus by which the heat treatment can be performed under a reduced-pressure atmosphere be used in order to remove the dispersant in the solution effectively. Further, a resist pattern is formed with the use of a photolithography method or the like over a porous thin film obtained by the heat treatment and unnecessary part of the porous thin film is selectively removed with the use of a dry etching method or a wet etching method. In this manner, the second partition 220 can be formed. Note that another heat treatment may be performed after the formation of the second partition 220 in order to remove moisture or water vapor remaining in the second partition. For the heat treatment, the temperature range or the apparatus when the above solution is subject to heat treatment can be employed.

As the particle of the metal oxide described above, it is possible to use a particle of the metal oxide including any one of silicon oxide, aluminum oxide, gallium oxide, tin oxide, titanium oxide, vanadium oxide, zirconium oxide, or niobium oxide as its main component or a particle of the metal oxide including a plurality of the above materials. Alternatively, as the particle of the metal oxide, a particle of any of the above materials including various metal components, for example, low melting point glass ground to particles, can be used. The metal component of the glass with a low melting point may be any component as long as it is described in a known document or data sheets of various products or it can be expected from the description. Further, for the dispersant, a known material may be used depending on the kind of the particle of the metal oxide to be used.

Alternatively, the second partition 220 can be formed as follows: a thin film of the metal oxide having a porous structure is formed by a vapour-phase deposition method such as a sputtering method or an evaporation method, and then a resist pattern is formed by a photolithography method or the like and unnecessary part of the thin film is selectively removed with the use of a dry etching method or a wet etching method. For example, the thin film of the metal oxide having a porous structure with a low density may be formed in the following manner: in a sputtering apparatus provided with a metal oxide target, sputtering treatment (also referred to as an oblique sputtering method or an oblique deposition method) is performed in a state where the base substrate 200 after the process up to and including the step of forming the first partition 218 is inclined to the metal oxide target (that is, in a state where the surface of the metal oxide target is not parallel to the surface of the base substrate 200 (the surface where the first partition 218 is formed)), preferably with an inclination of more than or equal to 15° and less than or equal to 90°, more preferably with an inclination of more than or equal to 30° and less than or equal to 90°. In this manner, the thin film of the metal oxide having a porous structure can be obtained by a shadowing effect (also referred to as a self-shadowing effect). In another vapour-phase deposition method, the film formation may be performed in a state where the base substrate 200 is inclined to the material supply source of the metal oxide in the above manner. As an example, in a magnetron sputtering apparatus provided with a silicon oxide target, for example, the film formation may be perforated in a state where the base substrate 200 is inclined to the target with an inclination of 50°.

Note that in the above method for forming the thin film of the metal oxide having a porous structure by the vapour-phase deposition method, it is assumed that a target (material supply source) is provided in the apparatus; however, two or more of targets (material supply sources) may be provided in the apparatus and the film formation may be performed in a state where the base substrate 200 is inclined to each of the targets (the material supply sources) with an inclination of more than or equal to 15° and less than or equal to 85°, preferably an inclination of more than or equal to 30° and less than or equal to 80°. With the method, for example, after a thin film having a porous structure is formed using a material used for the thin film of the metal oxide (hereinafter referred to as a material A) and a material different from the material A (hereinafter referred to as a material B; there is no particular limitation on the material B), etching treatment is performed on the thin film with the use of a solvent or the kind of gas in which a selectivity of the material B with respect to the material A is high (that is, the material B is etched more easily than the material A), whereby the material B is selectively etched and thus the thin film of the metal oxide having a porous structure including the material A as its main component can be formed. Note that when a solvent or the kind of gas with a low selectivity is used for the above etching treatment, the material A is etched and the thin film of the metal oxide having a porous structure gets vulnerable; therefore, the selectivity is more than or equal to 10, preferably more than or equal to 30.

Alternatively, the thin film of the metal oxide having a porous structure may be formed by a sol-gel method.

In this specification, the second partition 220 has a porous structure; however, the entire second partition 220 does not necessarily have a porous structure. For example, even when there is not a porous structure in the vicinity of a central portion of the second partition 220, the second partition 220 is effective in absorbing moisture or water vapor as long as there is a porous structure in the vicinity of the surface of the second partition 220. Accordingly, a "porous structure" in this specification means a structure in which there is a porous structure within a range of 10% in volume from the surface to the inside of the second partition 220 when the total volume of the second partition 220 (including a hole portion) is 100%.

Figure 3C:
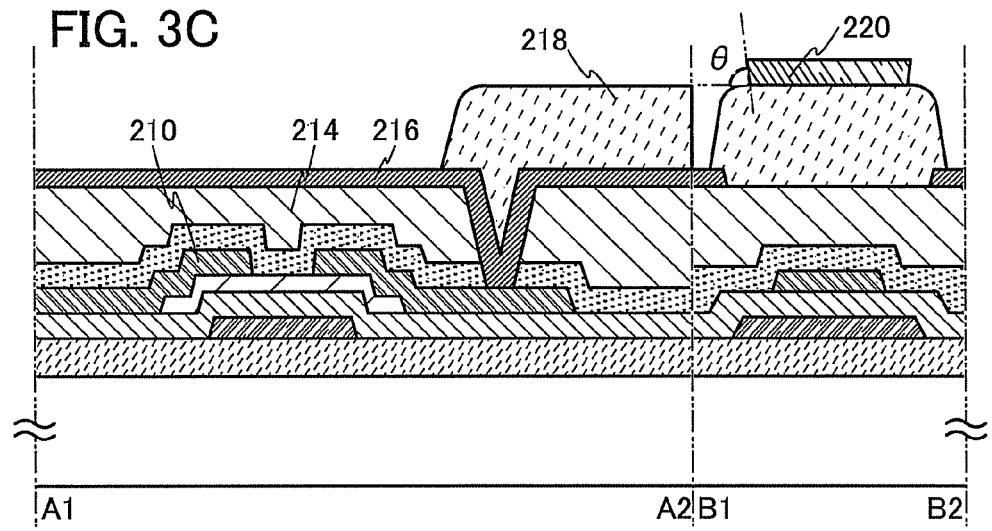

Note that in a cross section of the second partition 220 in FIG. 3B, the upper portion is smaller than that of the bottom portion; however, the width of the upper portion may be larger than that of the bottom portion as illustrated in FIG. 3C, that is, an inverted tapered shape may be formed. Here, an inverted tapered shape means that the angle between the upper surface of the first partition 218 and the side surface of the second partition 220 (an angle θ in FIG. 3C) is less than 90°.

The above is the description of the structure and the manufacturing method of the light-emitting portion and a peripheral portion of the light-emitting device in this embodiment, before the formation of the EL layer.

<Structure and Manufacturing Method of Light-Emitting Device>

The structure and the manufacturing method of the whole light-emitting device will be described below.

Figure 5A:
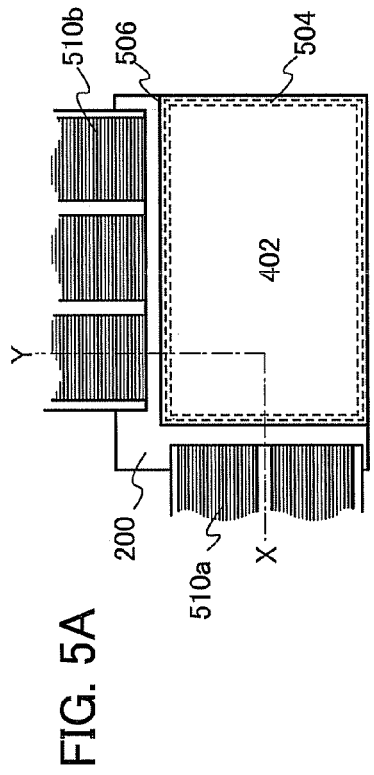
FIGS. 5A and 5B illustrate a structure of a light-emitting device.
Figure 5B:
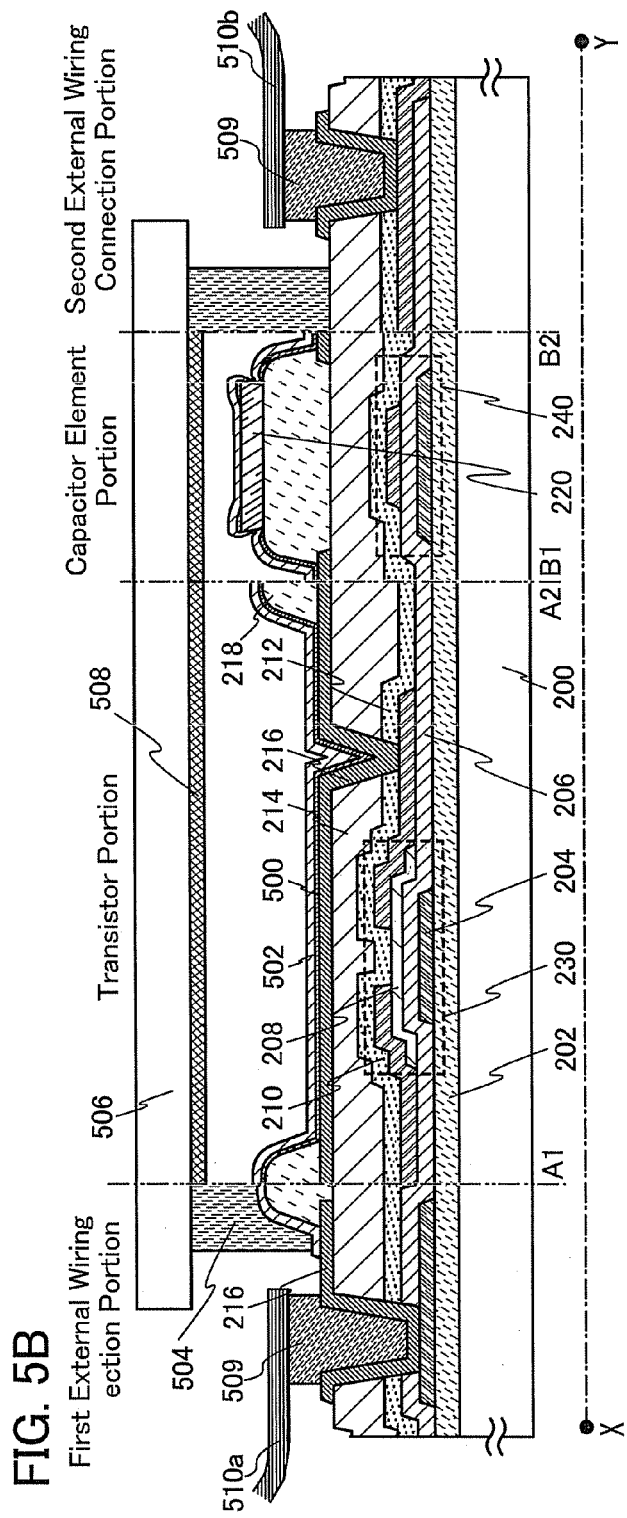

FIG. 5A illustrates a top view of an example of the structure of the light-emitting device in this embodiment and FIG. 5B illustrates a cross-sectional view taken along dashed-dotted line X-Y in FIG. 5A.

Note that the structure of the whole light-emitting device is not illustrated in the cross-sectional view in FIG. 5B; therefore, the structures of a first external wiring connection portion and a second external wiring connection portion for transmitting and receiving electric power and signals between the light-emitting device and an external device are illustrated together with, as an example, the structures of the transistor 230 and the capacitor 240 which are above light-emitting portions.

The light-emitting device in this embodiment includes, in addition to the base substrate 200, the base layer 202, the first electrode 204, the first insulating layer 206, the semiconductor layer 208, the second electrodes 210, the second insulating layer 212, the third insulating layer 214, the third electrode 216, the first partition 218, and the second partition 220 which are described above, an EL layer 500 formed over the third electrode 216, a fourth electrode 502 formed over the EL layer 500, a sealant 504 provided in the periphery of a light-emitting region 402, a counter substrate 506 which is bonded to the base substrate 200 with the sealant 504, and a color filter 508 provided on one surface of the counter substrate. Further, an external wiring 510a and an external wiring 510b are electrically connected to part of the light-emitting device through conductive materials 509.

A manufacturing method of the light-emitting device in this embodiment will be described below with reference to FIGS. 6A and 6B and FIG. 7.

First, the EL layer 500 is formed over the third electrode 216 and the fourth electrode 502 is formed over the EL layer 500 (see FIG. 6A). The fourth electrode 502 serves as one of electrodes between which the EL layer 500 is interposed, and thus is led to an external wiring connection portion and is electrically connected to an external wiring in a later step. In FIG. 6A, the fourth electrode 502 is led to the first external wiring connection portion and is electrically connected to the third electrode 216. In a later step, an external wiring is connected to the third electrode 216 in the first external wiring connection portion through a conductive material. Note that the third electrode 216 serves as the other of the electrodes between which the EL layer 500 is interposed, and thus is also led to the external wiring connection portion; however, the description with reference to the drawings is omitted.

The EL layer 500 may be formed using a material selected as appropriate according to the intended purpose of the light-emitting device, by a vacuum evaporation method such as a resistive heating evaporation method or an electron-beam evaporation method, for example. Note that the EL layer 500 is preferably a layer emitting white light. The details of the formation method and the material of the EL layer 500 will be described in Embodiment 2. The EL layer 500 is significantly deteriorated due to moisture, water vapor, oxygen, and the like and therefore is preferably formed inside the sealant to be provided in a later step (the center portion of the substrate). Further, in the case where the EL layer 500 is formed over part of the substrate as in FIG. 6A, for example, a mask (for example, a metal mask) provided with an opening portion is prepared, the mask is provided on the surface side of the substrate (the side where electrodes, an insulating layer, and the like are formed) so that the opening portion overlaps a region where the EL layer 500 is to be formed, and the EL layer 500 is formed by using the mask.

The EL layer 500 is sensitive to moisture, water vapor, oxygen, and the like; therefore, the EL layer 500 is preferably formed in a state with as little moisture as possible (for example, before the formation of the EL layer 500, vacuum is drawn until the pressure in the apparatus for the film formation of the EL layer 500 becomes $1 \times 10^{-4}$ Pa). Further, a later step of applying the sealant 504 to the base substrate 200 or a later step of bonding the base substrate 200 and the counter substrate 506 to each other is preferably performed in a state where the amount of moisture is low (for example, vacuum is drawn at least once until the pressure in the apparatus for performing the treatment becomes $1 \times 10^{-4}$ Pa, and then the apparatus is filled with a gas whose dew point is −70° C. or lower.).

The fourth electrode 502 may be formed using conductive metal oxide. As the conductive metal oxide, indium oxide ($In_2O_3$), tin oxide ($SnO_2$), zinc oxide (ZnO), an indium oxide-tin oxide alloy ($In_2O_3$—$SnO_2$, which is abbreviated to ITO in some cases), an indium oxide-zinc oxide alloy ($In_2O_3$—ZnO), or any of these metal oxide materials in which silicon or silicon oxide is included can be used. Note that in the case where the first electrode is formed at a predetermined place as in FIG. 6A, a mask or the like may be used as in the case of forming the EL layer 500.

Alternatively, a conductive composition containing a conductive macromolecule (also referred to as a conductive polymer) can be used to form the fourth electrode 502. As the conductive macromolecule, what is called a π-electron conjugated conductive macromolecule can be used. For example, polyaniline or a derivative thereof, polypyrrole or a derivative thereof, polythiophene or a derivative thereof, and a copolymer of two or more of aniline, pyrrole, and thiophene or a derivative thereof can be given. Alternatively, a material formed of 1 to 10 graphene sheets (corresponding to one layer of graphite) may be used.

In the case where the light-emitting device has a bottom emission structure, light does not need to be extracted through the counter substrate 506; therefore, the fourth electrode 502 can be formed of a single layer or a stack layer of any of metal materials such as aluminum, nickel, tantalum, chromium, tungsten, molybdenum, cobalt, manganese, magnesium, titanium, palladium, zirconium, beryllium, neodymium, scandium, gold, platinum, silver, and copper and an alloy containing any of these metal materials by an evaporation method such as a vacuum evaporation method or a PVD method such as a sputtering method, for example.

The third electrode 216, the EL layer 500, and the fourth electrode 502 overlap with one another to form a light-emitting element 450 and voltage application to this element causes light emission. In the light-emitting element 450, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. With such a mechanism, such a light-emitting element is called a current-excitation light-emitting element. Note that a protective film may be formed over the fourth electrode 502 in order to prevent entry of oxygen, hydrogen, moisture, carbon dioxide, or the like into the EL layer 500. As the protective film, a film selected from a silicon oxide film, a silicon oxynitride film, a silicon nitride film, a silicon nitride oxide film, a hafnium oxide film, an aluminum oxide film, a gallium oxide film, and a gallium aluminum oxide film, or a stack thereof may be formed. Note that in this embodiment, for the EL layer 500, an organic EL material is used; however, a known inorganic EL material may be used.

Note that in the case where the second partition 220 has an inverted tapered shape as described above, the EL layer 500 is formed by a formation method in which disconnection is easily generated on the side portion of the second partition 220 (for example, an evaporation method) and the fourth electrode 502 is formed by a formation method in which disconnection is hardly generated on the side portion of the second partition 220 (for example, a sputtering method). Thereby, as illustrated in a capacitor portion of FIG. 6A, disconnection is generated in the EL layer 500 or part of the EL layer 500 is extremely thin (for example, ⅕ or less of an intended thickness) due to the second partition 220, and disconnection is not generated in the fourth electrode 502 although part of the fourth electrode 502 is thin due to the second partition 220. Accordingly, light emission in a light-emitting element 450 is propagated to an adjacent light-emitting element 450 through the EL layer 500 (that is, due to light reflection in the EL layer 500), whereby a phenomenon in which a light-emitting element that does not need to emit light (that is, voltage application is not performed) emits light (also referred to as stray light) can be suppressed.

Further, although not illustrated in FIG. 6A, there is a plurality of fine air holes on the surface of the second partition 220; therefore, the EL layer 500 formed on the surface of the second partition 220 does not become a flat film and meander three-dimensionally along the shape of the fine air holes or disconnection is generated in part of the EL layer. Therefore, the above unnecessary light emission due to light propagated through the EL layer 500 can be reduced more effectively.

Next, the counter substrate 506 provided with the color filter 508 on one surface thereof is bonded to the base substrate 200 in a state where the sealant 504 is provided so as to cover the periphery of the light-emitting region 402, and the sealant 504 is cured (see FIG. 6B). The color filter 508 has a plurality of colors (for example, three colors of R (red), G (green), and B (blue), four colors including Y (yellow) in addition to the above three colors, five colors including C (cyan) in addition to the above four colors, or the like). When the counter substrate 506 is bonded to the base substrate 200, the bonding treatment needs to be performed so that one color filter (one color) does not overlap with the plurality of the light-emitting elements 450.

The counter substrate 506 can be formed using a material similar to that of the base substrate 200.

The bonding treatment is preferably performed in a treatment chamber that is maintained under reduced pressure with the use of a vacuum bonding apparatus or the like. Thus, entry of a component (moisture, water vapor, oxygen, and the like) which deteriorates the EL layer 500 in a space between the base substrate 200 and the counter substrate 506 can be suppressed and further a bubble generation in the sealant 504 can be suppressed.

Note that the curing treatment of the sealant 504 may be performed through one or plural kinds of processes selected from visible light irradiation treatment, UV light irradiation treatment, and heat treatment depending on material components of the sealant 504.

Figure 7:
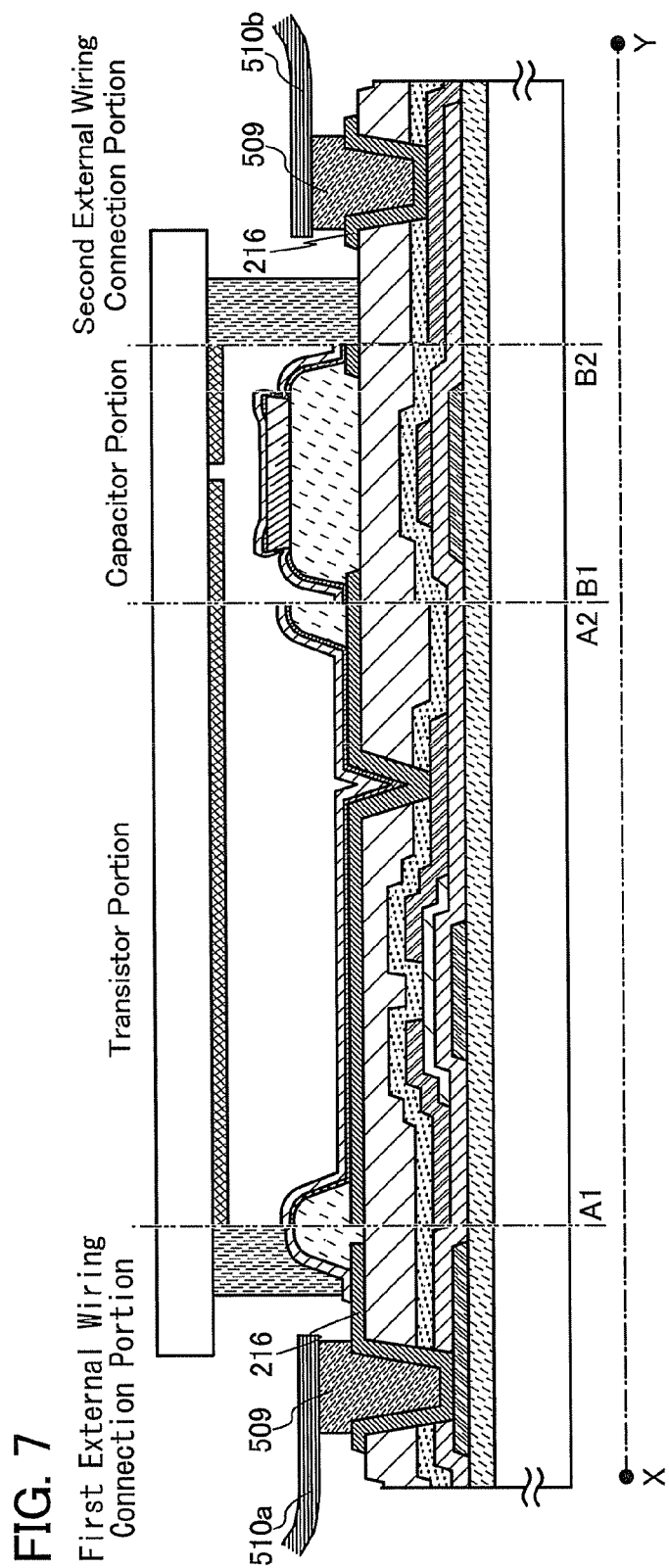
FIG. 7 illustrates a manufacturing method of a light-emitting device.

Next, conductive materials 509 are provided over the third electrode 216 provided in the first external wiring connection portion and the second external wiring connection portion, and the external wiring 510a and the external wiring 510b are bonded to the conductive materials 509 (see FIG. 7). Note that the external wiring 510a and the external wiring 510b are bonded to the third electrode 216 in this embodiment; however, the external wiring 510a and the external wiring 510b are not limited thereto and may be bonded to another electrode (a conductive layer).

As the conductive material 509, for example, a material including a conductive particle and an organic resin can be used. Specifically, a material in which conductive particles (for example, spherical particles or flake-like particles) each having a diameter of several nanometers to several tens of micrometers are dissolved or dispersed in an organic resin is used. As the conductive particles, metal particles of one or more of gold (Au), silver (Ag), copper (Cu), nickel (Ni), platinum (Pt), palladium (Pd), tantalum (Ta), molybdenum (Mo), titanium (Ti), aluminum (Al), and carbon (C), an insulating particle whose surface is provided with a metal film including any of the above metals, a microparticle of silver halide, a dispersible nanoparticle, a solder material, or the like can be used. Further, as the organic resin included in the conductive material 509, for example, a material similar to that of the first partition 218 may be used.

In providing the conductive material 509, any of the following printing machines such as a flexible printing machine, an offset printing machine, a gravure printing machine, a screen printing machine, an inkjet machine, and a dispenser may be used.

As the external wiring 510a and the external wiring 510b, for example, a printed wiring board or a flexible printed circuit (FPC) may be used.

For the connection process, the conductive material 509 may be treated under a condition for curing the conductive material 509 (visible light irradiation, UV light irradiation, heat treatment, or the like). To improve conductivity of the conductive material 509 and to prevent defective conduction between the third electrode 216 and the conductive material 509, pressure is preferably applied when the conductive material 509 is subjected to the connection process. For example, the connection process can be performed using a pressure bonding apparatus in which heat treatment is performed while pressure treatment is performed on the conductive material 509 and the external wiring 510a (or 510b).

In the light-emitting device manufactured through the above process, the second partition 220 having a porous structure is formed close to the light-emitting portion; therefore, moisture or water vapor which is not completely removed in the formation of the first partition 218, moisture or water vapor which is adsorbed onto the surface of the partition after the formation of the first partition 218, or moisture or water vapor which enters from the outside of the light-emitting device (particularly, moisture or water vapor which reaches the EL layer through the inside of the first partition) can be effectively absorbed. Therefore, deterioration of the EL layer 500 due to moisture or water vapor can be suppressed.

Further, the second partition 220 has an inverted tapered shape. Thereby, disconnection is generated in the EL layer 500 or part of the EL layer 500 is extremely thin (for example, ⅕ or less of an intended thickness) due to the second partition 220, and disconnection is not generated in the fourth electrode 502 although part of the fourth electrode 502 is thin due to the second partition 220. Accordingly, a phenomenon in which, light emitted from a light-emitting element 450 is propagated to an adjacent light-emitting element 450 through the EL layer 500 and thus the adjacent light-emitting element 450 emits light, can be suppressed.

Embodiment 2

In this embodiment, examples of the structure of a light-emitting element will be described with reference to FIGS. 8A to 8C and FIGS. 9A and 9B. The light-emitting element described as an example in this embodiment includes a third electrode 216, a fourth electrode 502, and an EL layer 500. One of the third electrode 216 and the fourth electrode 502 serves as an anode, and the other serves as a cathode. The EL layer 500 is interposed between the third electrode 216 and the fourth electrode 502. The structure of the EL layer 500 may be appropriately selected in accordance with materials of the third electrode 216 and the fourth electrode 502. Examples of the structure of the light-emitting element will be described below; it is needless to say that the structure of the light-emitting element is not limited to these examples.

<Structure Example 1 of Light-Emitting Element>

Figure 8A:
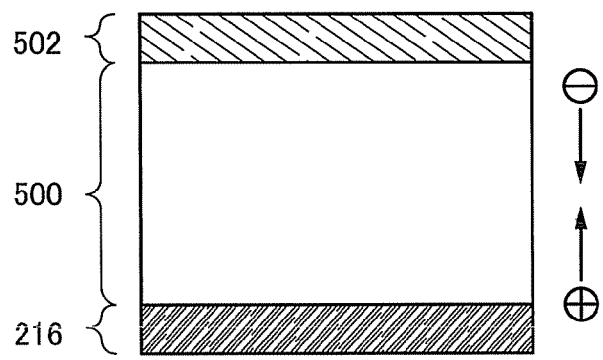
FIGS. 8A to 8C each illustrate a light-emitting element.

An example of the structure of the light-emitting element is illustrated in FIG. 8A. In FIG. 8A, the EL layer 500 is interposed between the third electrode 216 and the fourth electrode 502.

When voltage higher than the threshold voltage of the light-emitting element is applied between the third electrode 216 and the fourth electrode 502, holes are injected to the EL layer 500 from the third electrode 216 side and electrons are injected to the EL layer 500 from the fourth electrode 502 side. The injected electrons and holes are recombined in the EL layer 500 and a light-emitting substance contained in the EL layer 500 emits light.

In this specification, a layer or a stacked body which includes one region where electrons and holes injected from both ends are recombined is referred to as an EL layer. Therefore, it can be said that the structure example 1 of the light-emitting element includes one EL layer.

The EL layer 500 includes at least a light-emitting layer including the light-emitting substance, and may have a structure in which the light-emitting layer and a layer other than the light-emitting layer are stacked. Examples of the layer other than the light-emitting layer are layers containing a substance having a high hole-injection property, a substance having a high hole-transport property, a substance having a poor hole-transport property (substance which blocks holes), a substance having a high electron-transport property, a substance having a high electron-injection property, and a substance having a bipolar property (substance having high electron- and hole-transport properties).

Figure 8B:
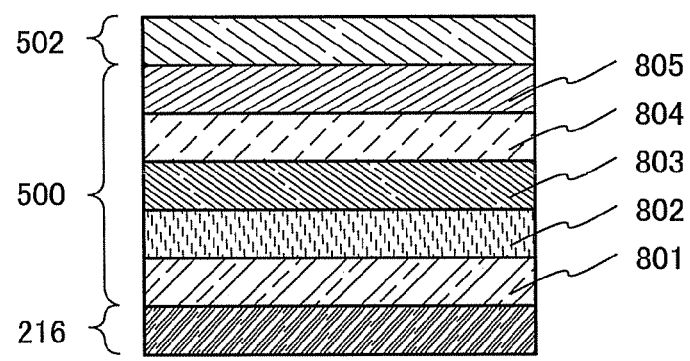

An example of a specific structure of the EL layer 500 is illustrated in FIG. 8B. The EL layer 500 illustrated in FIG. 8B has a structure in which a hole-injection layer 801, a hole-transport layer 802, a light-emitting layer 803, an electron-transport layer 804, and an electron-injection layer 805 are stacked in this order from the third electrode 216 side.

<Structure Example 2 of Light-Emitting Element>

Figure 8C:
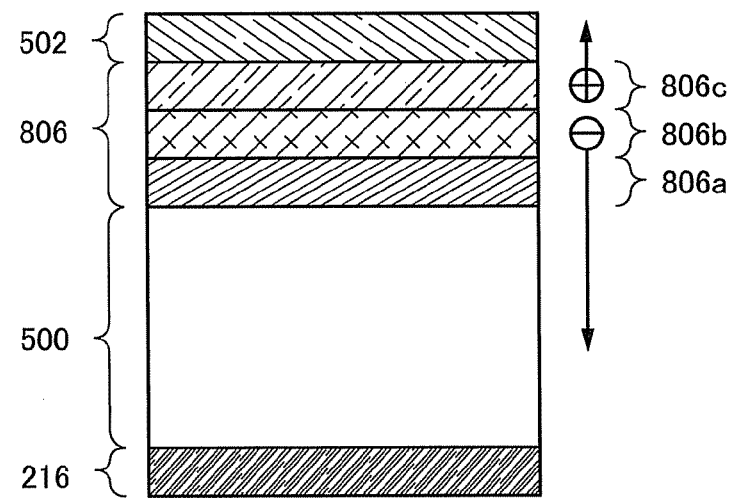

Another example of the structure of the light-emitting element is illustrated in FIG. 8C. In the light-emitting element illustrated as an example in FIG. 8C, the EL layer 500 is interposed between the third electrode 216 and the fourth electrode 502. Further, an intermediate layer 806 is provided between the fourth electrode 502 and the EL layer 500. The EL layer 500 in FIG. 8C can have a structure similar to that of the EL layer 500 in FIG. 8B.

The intermediate layer 806 may be formed to include at least a charge generation region, and may have a structure in which the charge generation region and a layer other than the charge generation region are stacked. For example, a structure can be employed in which a first charge generation region 806c, an electron-relay layer 806b, and an electron-injection buffer layer 806a are stacked in this order from the fourth electrode 502 side.

The behaviors of electrons and holes in the intermediate layer 806 will be described. When voltage higher than the threshold voltage of the light-emitting element is applied between the third electrode 216 and the fourth electrode 502, holes and electrons are generated in the first charge generation region 806c, and the holes move into the fourth electrode 502 and the electrons move into the electron-relay layer 806b. The electron-relay layer 806b has a high electron-transport property and immediately transfers the electrons generated in the first charge generation region 806c to the electron-injection buffer layer 806a. The electron-injection buffer layer 806a can reduce a barrier in injection of electrons into the EL layer 500, and the efficiency of the electron injection into the EL layer 500 can be improved. Thus, the electrons generated in the first charge generation region 806c are injected into the LUMO level of the EL layer 500 through the electron-relay layer 806b and the electron-injection buffer layer 806a.

In addition, the electron-relay layer 806b can prevent interaction in which the substance included in the first charge generation region 806c and the substance included in the electron-injection buffer layer 806a react with each other at the interface therebetween to damage the functions of the first charge generation region 806c and the electron-injection buffer layer 806a.

The range of choices of materials that can be used for the fourth electrode in the structure example 2 of the light-emitting element is wider than that of materials that can be used for the fourth electrode in the structure example 1 of the light-emitting element. This is because the fourth electrode of the structure example 2 can be formed using a material having a relatively high work function as long as the fourth electrode receives holes produced in the intermediate layer.

<Structure Example 3 of Light-Emitting Element>

Figure 9A:
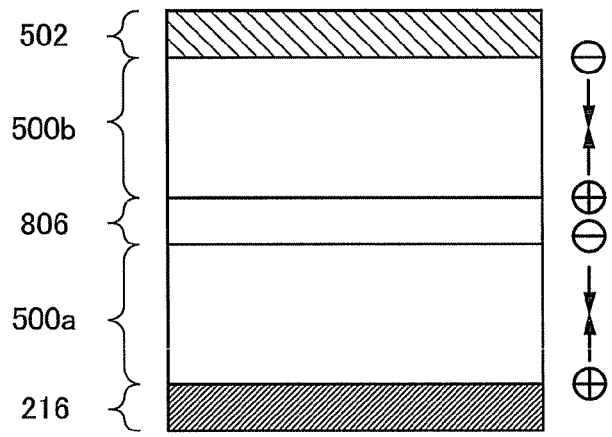
FIGS. 9A and 9B each illustrate a light-emitting element.
Figure 9B:
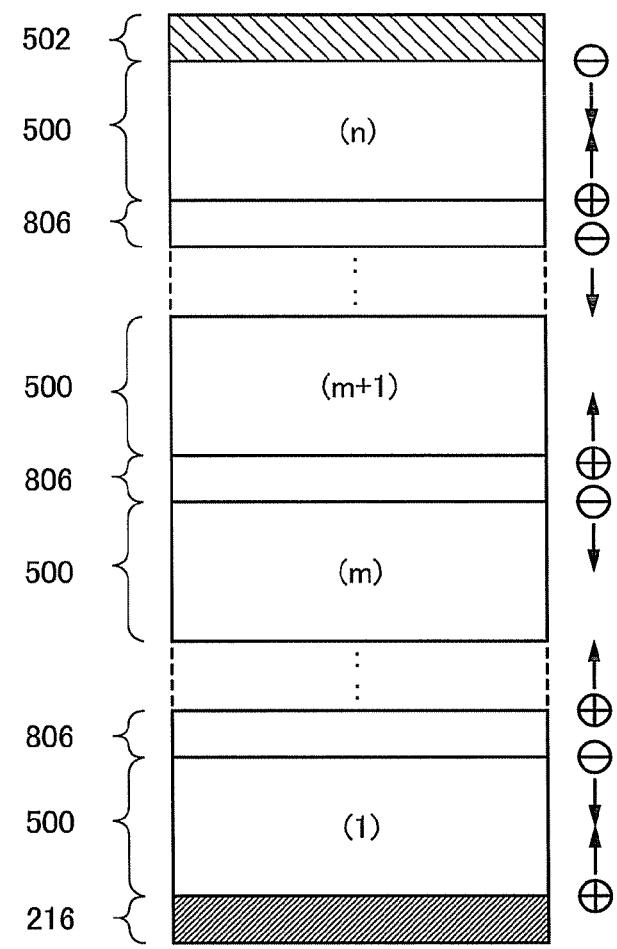

Another example of the structure of the light-emitting element is illustrated in FIG. 9A. In the light-emitting element illustrated as an example in FIG. 9A, an EL layer 500a and an EL layer 500b are interposed between the third electrode 216 and the fourth electrode 502. Further, an intermediate layer 806 is provided between the first EL layer 500a and the second EL layer 500b.

Note that the number of the EL layers provided between the third electrode 216 and the fourth electrode 502 is not limited to two. The light-emitting element illustrated as an example in FIG. 9B has a structure in which a plurality of EL layers 500 is stacked (what is called a tandem structure). Note that in the case where n (n is a natural number of 2 or more) EL layers 500 are provided between the third electrode 216 and the fourth electrode 502, the intermediate layer 806 is provided between an m-th (m is a natural number greater than or equal to 1 and less than or equal to n−1) EL layer and an (m+1)-th EL layer.

Note that a structure similar to that in the above structure example 1 of the light-emitting element can be applied to the EL layers 500 in the structure example 3 of the light-emitting element; a structure similar to that in the above structure example 2 of the light-emitting element can be applied to the intermediate layer 806 in the structure example 3 of the light-emitting element.

The behaviors of electrons and holes in the intermediate layer 806 provided between the EL layers will be described. When voltage higher than the threshold voltage of the light-emitting element is applied between the third electrode 216 and the fourth electrode 502, in the intermediate layer 806, holes and electrons are produced, and the holes move into the EL layer which is provided on the fourth electrode 502 side and the electrons move into the EL layer which is provided on the third electrode side. The holes injected into the EL layer which is provided on the fourth electrode side are recombined with the electrons injected from the fourth electrode side, so that the light-emitting substance contained in the EL layer emits light. The electrons injected into the EL layer which is provided on the third electrode side are recombined with the holes injected from the third electrode side, so that the light-emitting substance contained in the EL layer emits light. Thus, the holes and electrons produced in the intermediate layer 806 cause light emission in the respective EL layers.

Note that in the case where a structure which is the same as an intermediate layer is formed between the EL layers by providing the EL layers that are in contact with each other, the EL layers can be formed to be in contact with each other. Specifically, when a charge generation region is formed on one surface of the EL layer, the charge generation region functions as a first charge generation region of an intermediate layer; thus, the EL layers can be formed to be in contact with each other.

Structure examples 1 to 3 of the light-emitting element can be implemented in combination. For example, an intermediate layer may be provided between the fourth electrode 502 and the EL layer in the structure example 3 of the light-emitting element.

<Material for Light-Emitting Element>

Next, specific materials that can be used for the light-emitting elements having the above structures will be described; materials for the third electrode, the fourth electrode, and the EL layer will be described in this order.

<Material for Third Electrode>

The third electrode 216 is preferably formed using a metal, an alloy, an electrically conductive compound, a mixture of these materials, or the like, having a high work function; specifically, a work function of 4.0 eV or higher is preferable. Specifically, for example, indium tin oxide (ITO), indium tin oxide containing silicon or silicon oxide, indium zinc oxide, indium oxide containing tungsten oxide and zinc oxide, and the like are given.

Such conductive metal oxide films are usually formed by a sputtering method, but may also be formed by application of a sol-gel method or the like. For example, an indium-zinc oxide film can be formed by a sputtering method using a target in which zinc oxide is added to indium oxide at greater than or equal to 1 wt % and less than or equal to 20 wt %. A film of indium oxide containing tungsten oxide and zinc oxide can be formed by a sputtering method using a target in which tungsten oxide and zinc oxide are added to indium oxide at greater than or equal to 0.5 wt % and less than or equal to 5 wt % and greater than or equal to 0.1 wt % and less than or equal to 1 wt %, respectively.

Besides, as a material used for the third electrode 216, the following can be given: gold (Au), platinum (Pt), nickel (Ni), tungsten (W), chromium (Cr), molybdenum (Mo), iron (Fe), cobalt (Co), copper (Cu), palladium (Pd), titanium (Ti), nitride of a metal material (e.g., titanium nitride), molybdenum oxide, vanadium oxide, ruthenium oxide, tungsten oxide, manganese oxide, titanium oxide, and the like. Alternatively, a conductive polymer such as poly(3,4-ethylenedioxythiophene)/poly(styrenesulfonic acid) (PEDOT/PSS) or polyaniline/poly(styrenesulfonic acid) (PAni/PSS) may be used.

Note that in the case where a second charge generation region is provided in contact with the third electrode 216, a variety of conductive materials can be used for the third electrode 216 regardless of their work functions. Specifically, besides a material which has a high work function, a material which has a low work function can also be used for the third electrode 216. A material for forming the second charge generation region will be subsequently described together with a material for forming the first charge generation region.

<Material for Fourth Electrode>

In the case where the first charge generation region 806c is provided between the fourth electrode 502 and the EL layer 500 to be in contact with the fourth electrode 502, a variety of conductive materials can be used for the fourth electrode 502 regardless of their work functions.

Note that at least one of the fourth electrode 502 and the third electrode 216 is formed using a conductive film that transmits visible light. For the conductive film which transmits visible light, for example, indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, and indium tin oxide to which silicon oxide is added can be given. Further, a metal thin film having a thickness enough to transmit light (preferably, approximately 5 nm to 30 nm) can also be used.

<Material for EL Layer>

Specific examples of materials for the layers included in the above EL layer will be described below.

The hole-injection layer is a layer having a high hole-injection property. As the substance having a high hole-injection property, for example, molybdenum oxide, vanadium oxide, ruthenium oxide, tungsten oxide, manganese oxide, or the like can be used. Alternatively, it is possible to use a phthalocyanine-based compound such as phthalocyanine ($H_2Pc$) or copper phthalocyanine (CuPc), a high molecule such as poly(3,4-ethylenedioxythiophene)/poly(styrenesulfonic acid) (PEDOT/PSS), or the like to form the hole-injection layer.

Note that the hole-injection layer may be formed using the second charge generation region. When the second charge generation region is used for the hole-injection layer, a variety of conductive materials can be used for the third electrode 216 regardless of their work functions as described above. A material for forming the second charge generation region will be subsequently described together with a material for forming the first charge generation region.

<Hole-Transport Layer>

The hole-transport layer is a layer that contains a substance having a high hole-transport property. The hole-transport layer is not limited to a single layer, but may be a stack of two or more layers each containing a substance having a high hole-transport property. The hole-transport layer may contain any substance having a property of transporting more holes than electrons, and preferably contains a substance having a hole mobility higher than or equal to $10^{-6}$ cm$^2$/Vs because the driving voltage of the light-emitting element can be reduced.

<Light-Emitting Layer>

The light-emitting layer contains a light-emitting material. The light-emitting layer is not limited to a single layer, but may be a stack of two or more layers each containing a light-emitting substance. As the light-emitting substance, a fluorescent compound or a phosphorescent compound can be used. A phosphorescent compound is preferably used as the light-emitting substance because the emission efficiency of the light-emitting element can be increased.

<Electron-Transport Layer>

The electron-transport layer is a layer that contains a substance having a high electron-transport property. The electron-transport layer is not limited to a single layer, but may be a stack of two or more layers each containing a substance having a high electron-transport property. The electron-transport layer may contain any substance having a property of transporting more electrons than holes, and preferably contains a substance having an electron mobility higher than or equal to $10^{-6}$ cm$^2$/Vs because the driving voltage of the light-emitting element can be reduced.

<Electron-Injection Layer>

The electron-injection layer is a layer that contains a substance having a high electron-injection property. The electron-injection layer is not limited to a single layer, but may be a stack of two or more layers each containing a substance having a high electron-injection property. The electron-injection layer is preferably provided because the efficiency of electron injection from the fourth electrode 502 can be increased and the driving voltage of the light-emitting element can be reduced.

<Material for Charge Generation Region>

The first charge generation region 806c and the second charge generation region are regions containing a substance having a high hole-transport property and an acceptor substance. The charge generation region is not limited to a structure in which a substance having a high hole-transport property and an acceptor substance are contained in the same film, and may have a structure in which a layer containing a substance having a high hole-transport property and a layer containing an acceptor substance are stacked. Note that in the case of a stacked-layer structure in which the first charge generation region is provided on the fourth electrode side, the layer containing the substance having a high hole-transport property is in contact with the fourth electrode 502, and in the case of a stacked-layer structure in which the second charge generation region is provided on the third electrode side, the layer containing the acceptor substance is in contact with the third electrode 216.

Note that the acceptor substance is preferably added to the charge generation region so that the mass ratio of the acceptor substance to the substance having a high hole-transport property is from 0.1:1 to 4.0:1.

As the acceptor substance that is used for the charge generation region, a transition metal oxide and an oxide of a metal belonging to any of Groups 4 to 8 of the periodic table can be given. Specifically, molybdenum oxide is particularly preferable. Note that molybdenum oxide has a low hygroscopic property.

As the substance having a high hole-transport property used for the charge generation region, any of a variety of organic compounds such as an aromatic amine compound, a carbazole derivative, an aromatic hydrocarbon, and a high molecular compound (such as an oligomer, a dendrimer, or a polymer) can be used. Specifically, a substance having a hole mobility of $10^{-6}$ cm$^2$/Vs or higher is preferably used. Other than these substances, a substance that has a property of transporting more holes than electrons may be used.

<Material for Electron-Relay Layer>

The electron-relay layer 806b is a layer that can immediately receive electrons extracted by the acceptor substance in the first charge generation region 806c. Therefore, the electron-relay layer 806b is a layer that contains a substance having a high electron-transport property, and the LUMO level thereof is positioned between the acceptor level of the acceptor substance in the first charge generation region 806c and the LUMO level of the EL layer 500 in contact with the electron-relay layer. Specifically, the LUMO level of the electron-relay layer 806b is preferably about from $-5.0$ eV to $-3.0$ eV.

As the material used for the electron-relay layer 806b, for example, a perylene derivative and a nitrogen-containing condensed aromatic compound can be given. Note that a nitrogen-containing condensed aromatic compound is preferably used for the electron-relay layer 806b because of its stability. Furthermore, of nitrogen-containing condensed aromatic compounds, a compound having an electron-withdrawing group such as a cyano group or a fluoro group is preferably used, in which case electrons are easily received in the electron-relay layer 806b.

<Material for Electron-Injection Buffer Layer>

The electron-injection buffer layer 806a is a layer that facilitates electron injection from the first charge generation region 806c into the EL layer 500. The provision of the electron-injection buffer layer 806a between the first charge generation region 806c and the EL layer 500 makes it possible to reduce the injection barrier therebetween.

Any of the following substances having high electron injection properties can be used for the electron-injection buffer layer 806a: an alkali metal, an alkaline earth metal, a rare earth metal, a compound of the above metal (e.g., an alkali metal compound (e.g., an oxide such as lithium oxide, a halide, or carbonate such as lithium carbonate or cesium carbonate), an alkaline earth metal compound (e.g., an oxide, a halide, or carbonate), or a rare earth metal compound (e.g., an oxide, a halide, or carbonate)), and the like.

Further, in the case where the electron-injection buffer layer 806a contains a substance having a high electron-transport property and a donor substance, the donor substance is preferably added so that the mass ratio of the donor substance to the substance having a high electron-transport property is from 0.001:1 to 0.1:1. Note that as the donor substance, an organic compound such as tetrathianaphthacene (abbreviation: TTN), nickelocene, or decamethylnickelocene can be used as well as an alkali metal, an alkaline earth metal, a rare earth metal, a compound of the above metal (e.g., an alkali metal compound (including an oxide of lithium oxide or the like, a halide, and carbonate such as lithium carbonate or cesium carbonate), an alkaline earth metal compound (including an oxide, a halide, and carbonate), and a rare earth metal compound (including an oxide, a halide, and carbonate). Note that as the substance having a high electron-transport property, a material similar to the above-described material for the electron-transport layer that can be formed in part of the EL layer 500 can be used.

<Manufacturing Method of Light-Emitting Element>

The layers described above are combined as appropriate to form an EL layer. Any of a variety of methods (e.g., a dry process or a wet process) can be used for the EL layer depending on the material for the EL layer. For example, a vacuum evaporation method, an inkjet method, a spin coating method, or the like may be selected. Note that a different formation method may be employed for each layer.

The light-emitting element described in this embodiment can be fabricated by combination of the above-described materials. Light emission from the above-described light-emitting substance can be obtained with this light-emitting element, and the emission color can be selected by changing the type of the light-emitting substance. Further, when a plurality of light-emitting substances which emit light of different colors are used, the width of the emission spectrum can be expanded and, for example, white light emission can be obtained. Note that in order to obtain white light emission, light-emitting substances which emit light whose colors are complementary may be used, for example, different layers which emit light whose colors are complementary or the like can be used. Specific examples of complementary colors include "blue and yellow", "blue-green and red", and the like.

This embodiment can be implemented in combination with any of the other embodiments in this specification as appropriate.

Embodiment 3

In this embodiment, an example of the case where any of the light-emitting devices described in the above embodiments is applied to an electronic device will be described with reference to FIGS. 10A to 10C.

Figure 10A:
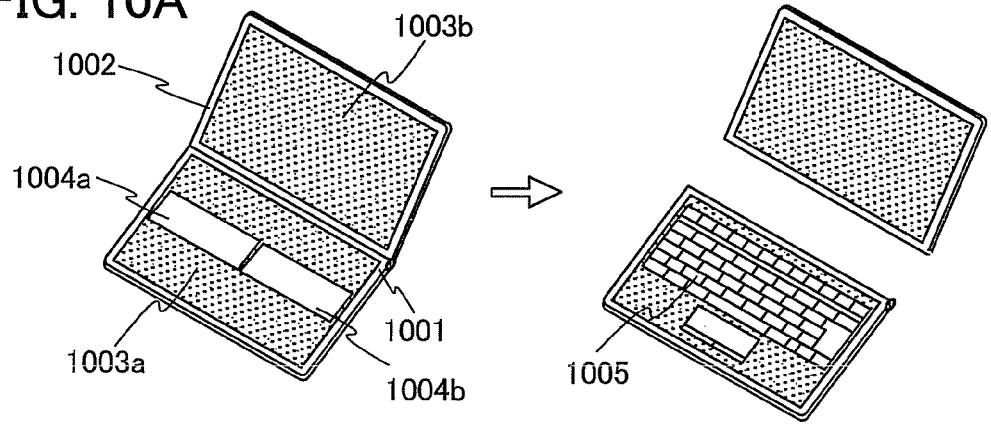
FIGS. 10A to 10C illustrate electronic devices each including a light-emitting device.

FIG. 10A illustrates a portable information terminal including a housing 1001, a housing 1002, a first display portion 1003a, a second display portion 1003b, and the like. Note that the first display portion 1003a and the second display portion 1003b are touch panels, and for example, as illustrated in the left in FIG. 10A, which of "touch input" and "keyboard input" is performed can be selected by selection buttons 1004a and 1004b displayed on the first display portion 1003a. Since the selection buttons with a variety of sizes can be displayed, the portable information terminal can be easily used by people of any generation. In the case where "keyboard input" is selected, for example, a keyboard 1005 is displayed on the first display portion 1003a as illustrated in the right of FIG. 10A. With the keyboard 1005, letters can be input quickly by keyboard input as in the case of using a conventional information terminal, for example.

Further, either of the first display portion 1003a and the second display portion 1003b can be detached from the portable information terminal as shown in the right in FIG. 10A. The first display portion 1003a and the second display portion 1003b each function as a touch panel and can be separately operated; therefore, one of the two display portions can be detached when it is carried around, which contributes to further reduction in weight. Further, the portable information terminal can be operated by using the housing 1001 at hand with the housing 1002 hung on a wall.

The portable information terminal in FIG. 10A can have a function of displaying a variety of information (e.g., a still image, a moving image, and a text image) on the display portion, a function of displaying a calendar, a date, the time, or the like on the display portion, a function of operating or editing information displayed on the display portion, a function of controlling processing by various kinds of software (programs), and the like. Furthermore, an external connection terminal (an earphone terminal, a USB terminal, or the like), a recording medium insertion portion, and the like may be provided on the back surface or the side surface of the housing.

The portable information terminal illustrated in FIG. 10A may be configured to be able to transmit and receive data wirelessly. Through wireless communication, desired book data or the like can be purchased and downloaded from an electronic book server.

Further, the housing 1002 illustrated in FIG. 10A may be equipped with an antenna, a microphone function, or a wireless communication function to be used as a mobile phone.

In the light-emitting device described in any of the above embodiments, deterioration of the EL layer due to moisture or water vapor is suppressed by an effect of the second partition and further, light can be prevented from leaking into an adjacent light-emitting element through the EL layer. Therefore, by using the light-emitting device for the first display portion 1003a, the second display portion 1003b, and the like, a high-value-added portable information terminal having an excellent display capability, in which deterioration of a light-emitting state due to moisture or water vapor is suppressed, can be provided.

Figure 10B:
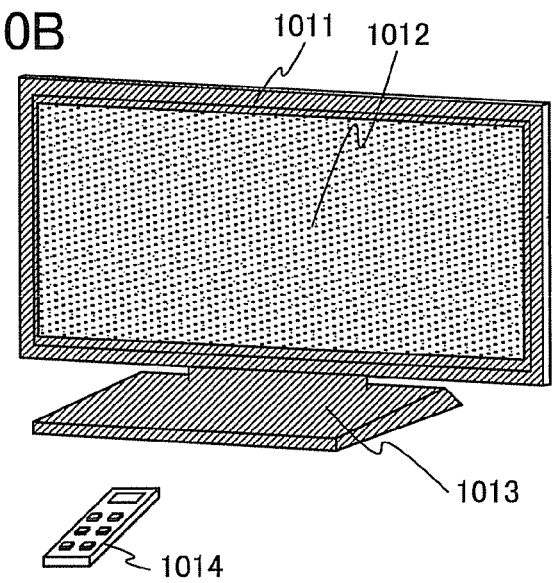

FIG. 10B is a television set, which includes a housing 1011, a display portion 1012, a stand 1013, and the like. The television set can be operated with a switch of the housing 1011 and a separate remote controller 1014. In such a television set, by using the light-emitting device described in the above embodiments for the display portion 1012 and the like, a high-value-added television set having an excellent display capability, in which deterioration of a light-emitting state due to moisture or water vapor is suppressed, can be provided.

Figure 10C:
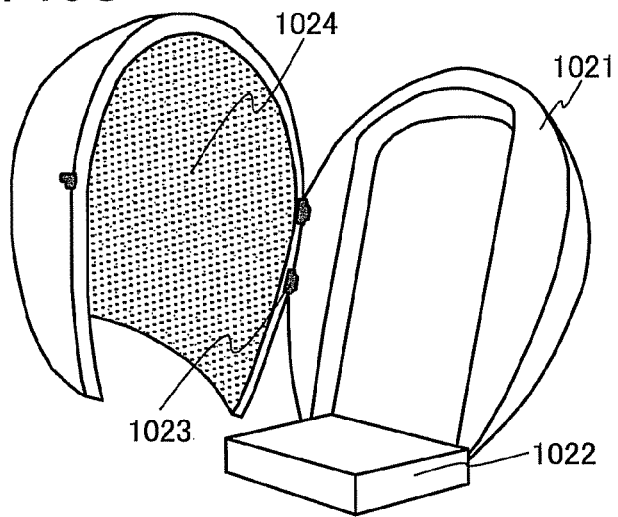

FIG. 10C illustrates a dome-shaped image display device including a main body 1021, a seat 1022, a hinge 1023, a display portion 1024, and the like. In the dome-shaped image display device, the display portion 1024 needs to be curved. In the manufacturing method of the light-emitting device described in the above embodiment, as the base substrate 200 and the counter substrate 506, a flexible substrate such as any of various plastic substrates can be used; therefore, the light-emitting device described in the above embodiments can be provided at a curved portion. In such a dome-shaped image display device, by using the light-emitting device described in the above embodiments for the display portion 1024 and the like, a high-value-added dome-shaped image display device having an excellent display capability, in which deterioration of a light-emitting state due to moisture or water vapor is suppressed, can be provided.

Figure 11:
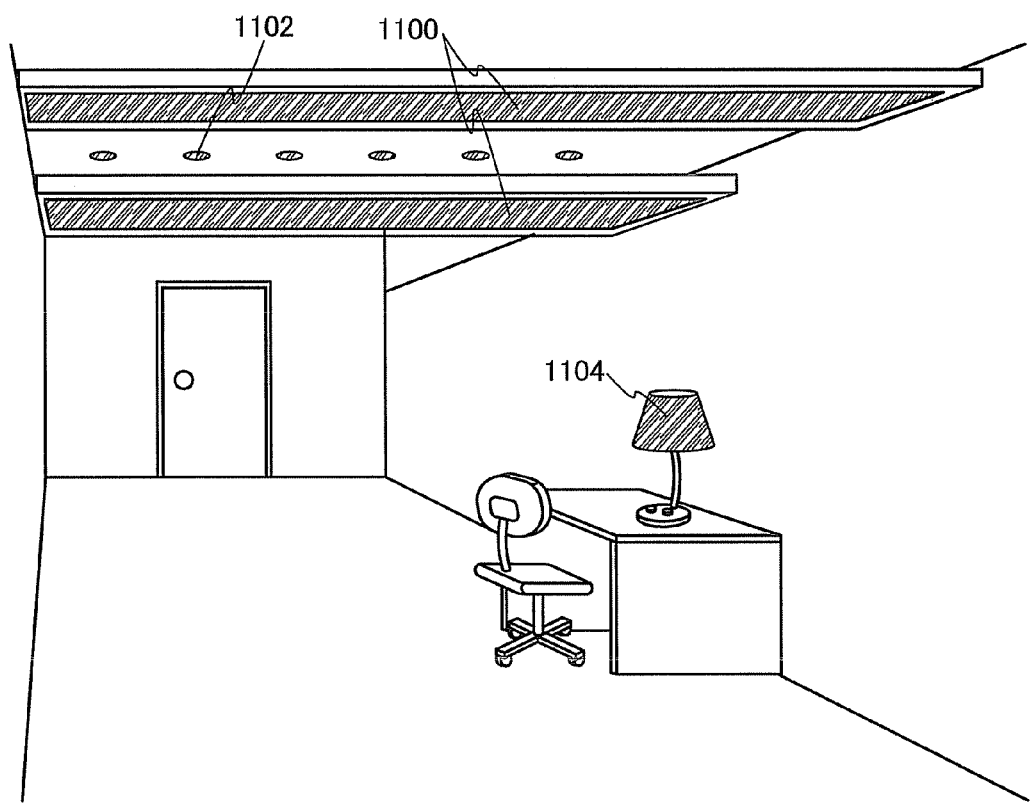
FIG. 11 illustrates electronic devices each including a light-emitting device.

FIG. 11 illustrates an example of a case where the light-emitting device in this embodiment is used for a lighting device. As the lighting device 1100, the light-emitting device disclosed in this specification is attached to a ceiling surface for the purpose of illuminating the whole room brightly. Further, as the lighting device 1102, the light-emitting device disclosed in this specification is attached to the inside of hemispherical recesses formed in the ceiling for the purpose of using the light-emitting device as a spotlight partially illuminating the room brightly. In the light-emitting device disclosed in this specification, the base substrate 200 and the counter substrate 506 are each formed using a flexible substrate such as a plastic substrate. Thus, the light-emitting device can be attached to a curved surface or the like; therefore, it can be used for lighting devices having a variety of shapes and use applications. For example, the light-emitting device disclosed in this specification can be attached to a curved surface and used as a desk lamp 1104.

This application is based on Japanese Patent Application serial no. 2011-140783 filed with Japan Patent Office on Jun. 24, 2011, the entire contents of which are hereby incorporated by reference.

What is claimed is:

1. A light-emitting device comprising:
   a transistor;
   a first electrode over and electrically connected to the transistor;
   a first partition comprising an opening portion over the first electrode and covering an end portion of the first electrode;
   a second partition over the first partition;
   a light-emitting layer over the first electrode, the first partition, and the second partition; and
   a second electrode over the light-emitting layer,
   wherein the second partition comprises a metal oxide having a porous structure in which a plurality of holes is included.

2. The light-emitting device according to claim 1, wherein the second partition has a porosity of 50% or more within a range of 10% in volume from a surface to an inside of the second partition when a total volume of the second partition comprising the plurality of holes is 100%.

3. The light-emitting device according to claim 1, wherein 50% or more of cross sections of pores formed in a cross section of the second partition each have an area of more than or equal to 1 nm$^2$ and less than or equal to 10000 nm$^2$.

4. The light-emitting device according to claim 1, wherein the second partition surrounds the first electrode.

5. The light-emitting device according to claim 1, wherein an angle between an upper surface of the first partition and a side surface of the second partition is less than 90°.

6. The light-emitting device according to claim 1, wherein the second partition comprises at least one selected from the group consisting of silicon oxide, aluminum oxide, gallium oxide, tin oxide, titanium oxide, vanadium oxide, zirconium oxide, and niobium oxide.

7. The light-emitting device according to claim 1, wherein the transistor comprises an oxide semiconductor in a channel formation region.

8. The light-emitting device according to claim 7, wherein the oxide semiconductor comprises indium, gallium, and zinc.

9. A light-emitting device comprising:
   a transistor comprising:
      a gate electrode;
      a first insulating layer over the gate electrode;
      a semiconductor layer over the first insulating layer; and
      a first electrode and a second electrode over and electrically connected to the semiconductor layer;
   a capacitor comprising:
      the gate electrode;
      the first insulating layer; and
      the first electrode;
   a third electrode over and electrically connected to the second electrode;
   a first partition comprising an opening over the third electrode and covering an end portion of the third electrode;
   a second partition over the first partition;
   a light-emitting layer over the third electrode, the first partition, and the second partition; and
   a fourth electrode over the light-emitting layer,
   wherein the second partition comprises a metal oxide having a porous structure in which a plurality of holes is included, and
   wherein the capacitor overlaps with the second partition.

10. The light-emitting device according to claim 9, wherein the second partition has a porosity of 50% or more within a range of 10% in volume from a surface to an inside of the second partition when a total volume of the second partition comprising the plurality of holes is 100%.

11. The light-emitting device according to claim 9, wherein 50% or more of cross sections of pores formed in a cross section of the second partition each have an area of more than or equal to 1 nm$^2$ and less than or equal to 10000 nm$^2$.

12. The light-emitting device according to claim 9, wherein the second partition surrounds the third electrode.

13. The light-emitting device according to claim 9, wherein an angle between an upper surface of the first partition and a side surface of the second partition is less than 90°.

14. The light-emitting device according to claim 9, wherein the second partition comprises at least one selected from the group consisting of silicon oxide, aluminum oxide, gallium oxide, tin oxide, titanium oxide, vanadium oxide, zirconium oxide, and niobium oxide.

15. The light-emitting device according to claim 9, wherein the semiconductor layer comprises an oxide semiconductor.

16. The light-emitting device according to claim 15, wherein the oxide semiconductor comprises indium, gallium, and zinc.

* * * * *